US011620505B2

United States Patent
Jang et al.

(10) Patent No.: US 11,620,505 B2
(45) Date of Patent: Apr. 4, 2023

(54) NEUROMORPHIC PACKAGE DEVICES AND NEUROMORPHIC COMPUTING SYSTEMS

(71) Applicant: Samsung Electronics Co., Ltd., Suwon-si (KR)

(72) Inventors: Jaehun Jang, Hwaseong-si (KR); Hongrak Son, Anyang-si (KR); Changkyu Seol, Osan-si (KR); Pilsang Yoon, Hwaseong-si (KR); Junghyun Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 354 days.

(21) Appl. No.: 16/881,963

(22) Filed: May 22, 2020

(65) Prior Publication Data
US 2021/0125048 A1 Apr. 29, 2021

(30) Foreign Application Priority Data
Oct. 28, 2019 (KR) ........................ 10-2019-0134618

(51) Int. Cl.
*G06N 3/063* (2006.01)
*G11C 11/54* (2006.01)
(Continued)

(52) U.S. Cl.
CPC ............. *G06N 3/0635* (2013.01); *G06N 3/04* (2013.01); *G11C 13/003* (2013.01); *G11C 11/54* (2013.01);
(Continued)

(58) Field of Classification Search
CPC .......... G06N 3/0635; G06N 3/04; G06N 3/08; G06N 3/0454; G06N 3/049; G06N 3/063;
(Continued)

(56) References Cited

U.S. PATENT DOCUMENTS

| 5,138,695 A | 8/1992 | Means et al. |
| 5,471,627 A | 11/1995 | Means et al. |

(Continued)

FOREIGN PATENT DOCUMENTS

| CN | 111386572 A | * 7/2020 | ............. G11C 11/54 |
| EP | 0422348 A2 | 4/1991 | |
| JP | 2008250846 A | 10/2008 | |
| KR | 10-2008-0054073 A | 6/2008 | |

*Primary Examiner* — Sultana Begum
(74) *Attorney, Agent, or Firm* — Muir Patent Law, PLLC

(57) ABSTRACT

A neuromorphic package device includes a systolic array package and a controller. The systolic array package includes neuromorphic chips arranged in a systolic array along a first direction and a second direction. The controller communicates with a host controls the neuromorphic chips. Each of the neuromorphic chips sequentially transfers weights of a plurality of layers of a neural network system in the first direction to store the weights. A first neuromorphic chip performs a calculation based on stored weights therein and an input data received in the second direction, and provides a result of the calculation to at least one of a second neuromorphic chip and a third neuromorphic chip which are adjacent to the first neuromorphic chip. The at least one of the second and third neuromorphic chips performs a calculation based on a provided result of the calculation and stored weights therein.

20 Claims, 18 Drawing Sheets

(51) Int. Cl.
*G06N 3/04* (2023.01)
*G11C 13/00* (2006.01)

(52) U.S. Cl.
CPC ...... *G11C 2213/15* (2013.01); *G11C 2213/79* (2013.01)

(58) Field of Classification Search
CPC .. G06N 20/00; G11C 13/003; G11C 13/0007; G11C 11/54; G11C 2213/15; G11C 2213/79
See application file for complete search history.

(56) References Cited

U.S. PATENT DOCUMENTS

| | | |
|---|---|---|
| 8,332,340 B2 | 12/2012 | Snider |
| 2014/0358834 A1* | 12/2014 | Kim .................. G11C 11/54 |
| | | 706/25 |
| 2017/0103315 A1* | 4/2017 | Thorson ................ G06N 5/04 |
| 2017/0256239 A1 | 9/2017 | Zaharia et al. |
| 2018/0173600 A1 | 6/2018 | Delacruz et al. |
| 2018/0285721 A1* | 10/2018 | Lee ..................... G06N 3/0635 |
| 2019/0164035 A1 | 5/2019 | Kwon et al. |
| 2020/0279169 A1* | 9/2020 | Hoskins ................ G06N 3/084 |
| 2020/0326889 A1* | 10/2020 | Norman .............. G06F 13/4282 |

\* cited by examiner

NEUROMORPHIC PACKAGE DEVICES AND NEUROMORPHIC COMPUTING SYSTEMS

CROSS-REFERENCE TO RELATED APPLICATION

This application claims priority under 35 USC § 119 to Korean Patent Application No. 10-2019-0134618, filed on Oct. 28, 2019, in the Korean Intellectual Property Office (KIPO), the disclosure of which is incorporated in its entirety by reference herein.

BACKGROUND

1. Technical Field

Exemplary embodiments relate generally to artificial intelligence, and more particularly to neuromorphic package devices and neuromorphic computing systems.

2. Discussion of the Related Art

A brain includes hundreds of billions of neurons that are interconnected with one another in a complicated nerve network. Neurons are responsible for the intellectual capability for learning and memory. Neurons use their synapses to exchange signals with thousands of other neurons. Thus, the neurons are the structural and functional base units for data transmission. A synapse refers to a junction between two neurons at which an axon of a first neuron and a dendrite of a second neuron are positioned next to each other for exchange of signals. A single neuron is generally connected with thousands of other neurons via synapses.

A neuromorphic chip refers to a semiconductor circuit that is designed to mimic the operation of biological nervous system. A neuromorphic chip may be used to implement an intelligent system that is capable of adapting itself to an unspecified environment.

SUMMARY

Some exemplary embodiments provide neuromorphic package device capable of enhancing performance by employing systolic array configuration.

Some exemplary embodiments provide a neuromorphic computing system capable of enhancing performance by employing systolic array configuration.

According to some exemplary embodiments, a neuromorphic package device includes a systolic array package and a controller. The systolic array package includes a plurality of neuromorphic chips arranged in a systolic array along a first direction and a second direction. The controller communicates with a host external to the neuromorphic package and controls the plurality of neuromorphic chips. Each of the plurality of neuromorphic chips sequentially transfers weights of a plurality layers of a neural network system in the first direction to store the weights. A first neuromorphic chip of the plurality of neuromorphic chips performs a calculation based on stored weights therein and an input data received in the second direction, and provides a result of the calculation to at least one of a second neuromorphic chip and a third neuromorphic chip, the second neuromorphic chip is adjacent to the first neuromorphic chip in the first direction and the third neuromorphic chip is adjacent to the first neuromorphic chip in the second direction. The at least one neuromorphic chip of the second neuromorphic chip and the third neuromorphic chip performs a calculation based on a provided result of the calculation and stored weights therein.

According to exemplary embodiments, a neuromorphic computing system includes a host and at least one neuromorphic package controlled by the host. The host includes at least one of a central processing unit (CPU), a graphics processing unit (GPU), an application specific integrated circuit (ASIC), or a field programmable gate array (FPGA) and storing a FPGA image. The at least one neuromorphic package includes a systolic array package and a controller. The systolic array package includes a plurality of neuromorphic chips arranged in a systolic array along a first direction and a second direction. The controller communicates with a host external to the neuromorphic package and controls the plurality of neuromorphic chips. Each of the plurality of neuromorphic chips sequentially transfers weights of a plurality layers of a neural network system in the first direction to store the weights. A first neuromorphic chip of the plurality of neuromorphic chips performs a calculation based on stored weights therein and an input data received in the second direction, and provides a result of the calculation to at least one of a second neuromorphic chip and a third neuromorphic chip, the second neuromorphic chip is adjacent to the first neuromorphic chip in the first direction and the third neuromorphic chip is adjacent to the first neuromorphic chip in the second direction. The at least one of the second neuromorphic chip and the third neuromorphic chip performs a calculation based on a result of the calculation provided from the first neuromorphic chip and weights stored therein.

According to exemplary embodiments, a neuromorphic package device includes a systolic array package and a controller. The systolic array package includes a plurality of neuromorphic chips arranged in a systolic array along a first direction and a second direction. The controller communicates with a host external to the neuromorphic package and controls the plurality of neuromorphic chips. Each of the plurality of neuromorphic chips sequentially transfers weights of a plurality layers of a neural network system in the first direction to store the weights. A first neuromorphic chip of the plurality of neuromorphic chips performs a calculation based on stored weights therein and an input data received in the second direction, and provides a result of the calculation to at least one of a second neuromorphic chip and a third neuromorphic chip, the second neuromorphic chip is adjacent to the first neuromorphic chip in the first direction and the third neuromorphic chip is adjacent to the first neuromorphic chip in the second direction. The at least one of the second neuromorphic chip and the third neuromorphic chip performs a calculation based on a result of the calculation provided from the first neuromorphic chip and weights stored therein. Each of the plurality of neuromorphic chips includes a neuromorphic core and a a plurality of embedded field programmable gate array (FPGA)s disposed adjacently to the neuromorphic core. The neuromorphic core includes a synapse array coupled to a plurality of row lines and a plurality of column lines, and the synapse array includes a plurality of synapses to store the weights and to perform the calculation based on the weights and the input data. The embedded FPGAs communicate with an adjacent neuromorphic core or an outside. The controller programs the embedded FPGAs based on a FPGA image provided from the host. Each of the embedded FPGAs is configured to use one of Peripheral Component Interconnect Express (PCIe) interface protocol, Cache Coherent Interconnect for accelerators (CCIX) interface protocol and Gen-Z interface protocol. Each of the embedded FPGAs is configured to perform one of a transmission operation and a reception operation.

Accordingly, the neuromorphic package device may enhance performance by employing systolic array configuration.

BRIEF DESCRIPTION OF THE DRAWINGS

Illustrative, non-limiting exemplary embodiments will be more clearly understood from the following detailed description in conjunction with the accompanying drawings.

DETAILED DESCRIPTION OF THE EMBODIMENTS

Exemplary embodiments will be described more fully hereinafter with reference to the accompanying drawings.

An artificial intelligence system is a computer system that implements human-level intelligence, and unlike the existing rule-based smart systems, a machine learns, judges, and becomes smart. The more the artificial intelligence systems are used, the recognition capabilities of the system are further improved and user preferences are more accurately identified and thus, existing rule-based smart systems are increasingly being replaced by deep-learning-based artificial intelligence systems.

Artificial intelligence technology is composed of machine learning (for example, deep learning) and element technology utilizing machine learning.

Machine learning is an algorithm technology that classifies/learns the characteristics of input data by itself. Element technology is technology that simulates functions such as recognition and judgment of the human brain using a machine learning algorithm such as deep learning. The element technology is composed of linguistic understanding, visual understanding, reasoning/prediction, knowledge representation, and motion control.

Figure 1:
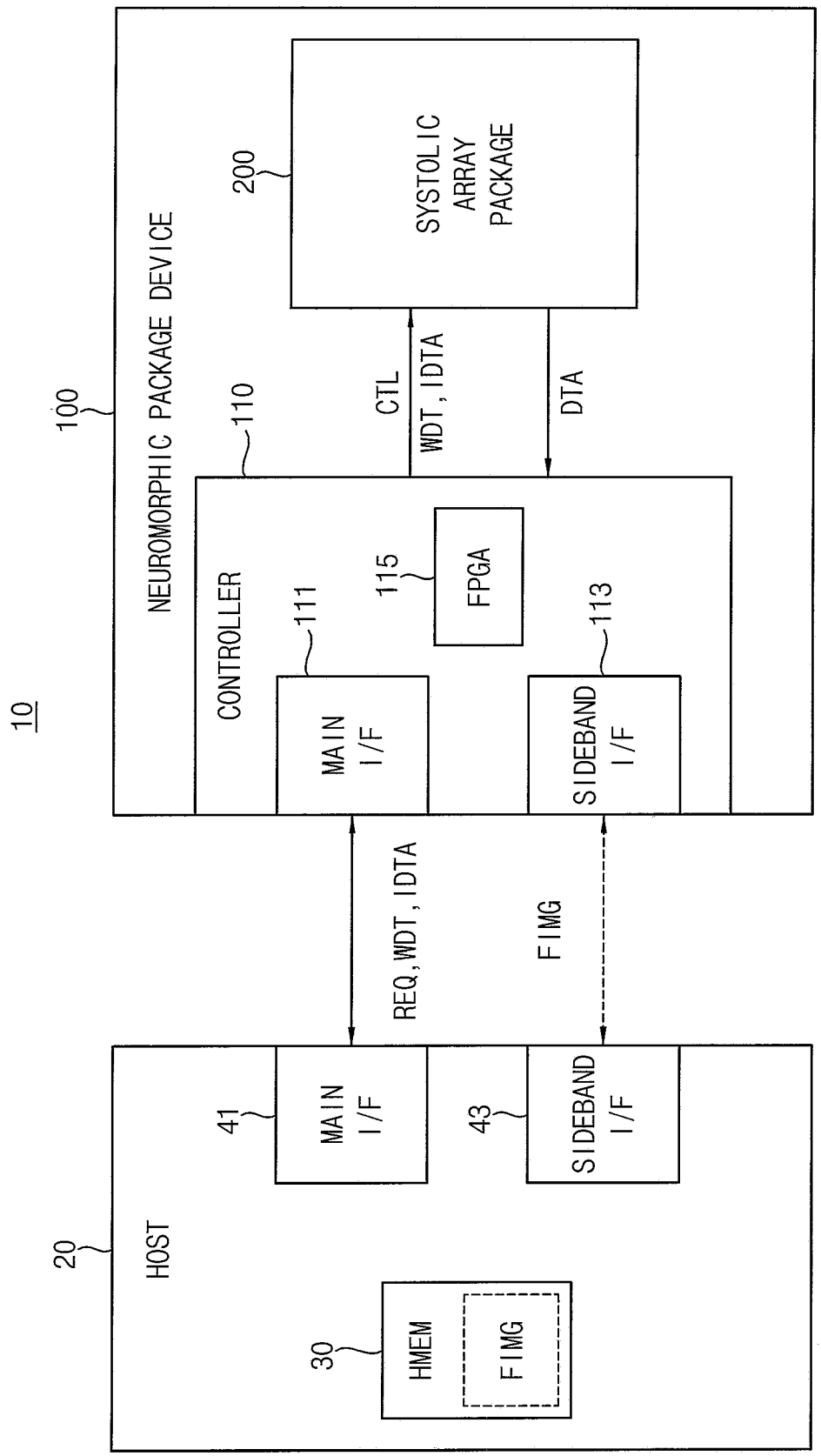
FIG. 1 is a block diagram illustrating an electronic device including a neuromorphic package device, according to exemplary embodiments.

FIG. 1 is a block diagram illustrating an electronic device including a neuromorphic package device, according to exemplary embodiments.

Referring to FIG. 1, an electronic device (a neuromorphic computing system) 10 may include a host 20 and a neuromorphic package device 100.

The host 20 may include a main interface circuit 41, a sideband interface circuit 43, and a host memory 30. The host 20 may provide a service to a user by communicating with the neuromorphic package device 100. For example, the host 20 may provide the neuromorphic package device 100 with weights WDT and an input data IDTA, and may provide a request REQ to the neuromorphic package device 100. In addition, the host 20 may allow a controller 110 of the neuromorphic package device 100 to be updated in hardware and/or in software.

The host memory 30 may store data for communicating with the neuromorphic package device 100. For example, the host memory 30 may store the weights WDT to be stored in the neuromorphic package device 100, and may store data read from the neuromorphic package device 100. In addition, the host memory 30 may store data which are used for managing the neuromorphic package device 100. For example, the host memory 30 may store a field programmable gate array (FPGA) image FIMG which is used for updating an FPGA 115.

The neuromorphic package device 100 may include the controller 110 and a systolic array package 200. The systolic array package 200 may include a plurality of neuromorphic chips arranged in a systolic array along a first direction and a second direction, each of the plurality of neuromorphic chips may sequentially transfer weights of a plurality layers of a neural network system in the first direction to store the weights, a first neuromorphic chip of the plurality of neuromorphic chips may perform a calculation based on stored weights therein and an input data received in the second direction, and may provide a result of the calculation to at least one of a second neuromorphic chip and a third neuromorphic chip, the second neuromorphic chip is adjacent to the first neuromorphic chip in the first direction and the third neuromorphic chip is adjacent to the first neuromorphic chip in the second direction, and the at least one neuromorphic chip may perform a calculation based on provided result of the calculation and stored weights therein. Each chip described herein may be formed on a die formed from a wafer and may include an integrated circuit therein.

The controller 110 may provide the systolic array package 200 with a control signal CTL to control the neuromorphic chips based on the request REQ, may provide the weights WDT and the input data IDTA to the systolic array package 200 and may receive from the systolic array package 200, a final data DTA corresponding to a result of calculations performed in the neuromorphic chips. The request REQ may include performance information requested by the host 20.

The controller 110 may include a main interface circuit 111, a sideband interface circuit 113, and the FPGA 117. The controller 110 may control overall operations of the neuromorphic package device 100. For example, the communication between the host 20 and the neuromorphic package device 100 may be performed through the main interface circuits 41 and 111. For example, the main interface circuits 41 and 111 may communicate with each other in compliance with a peripheral component interconnect express (PCIe) interface protocol.

However, this is an example. One or more of various interface protocols such as USB, small computer system interface (SCSI), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS) may be adopted for the communication between the main interface circuits 41 and 111.

The controller 110 may be configured to update the FPGA 117 provided in the controller 110 in response to the request REQ received from the host 20. For example, the FPGA image FIMG may be received for communication between the main interface circuits 41 and 111. Additionally/alternatively, the FPGA image FIMG may be performed for communication between the sideband interface circuits 43 and 113.

The sideband interface circuits 43 and 113 may communicate with each other in compliance with the protocol defined in the management component transport protocol (MCTP) specification or a system management bus (SM-Bus) specification.

In this example, each of the sideband interface circuits 43 and 113 may adopt a universal asynchronous receiver transmitter (UART), an inter-integrated circuit (I2C), and/or a serial programming interface (SPI) as a physical layer. However, these examples are not intended to limit the present disclosure. The sideband interface circuits 43 and 113 may adopt one or more of various sideband interface protocols for the purpose of assisting the main interface circuits 41 and 111.

Figure 2:
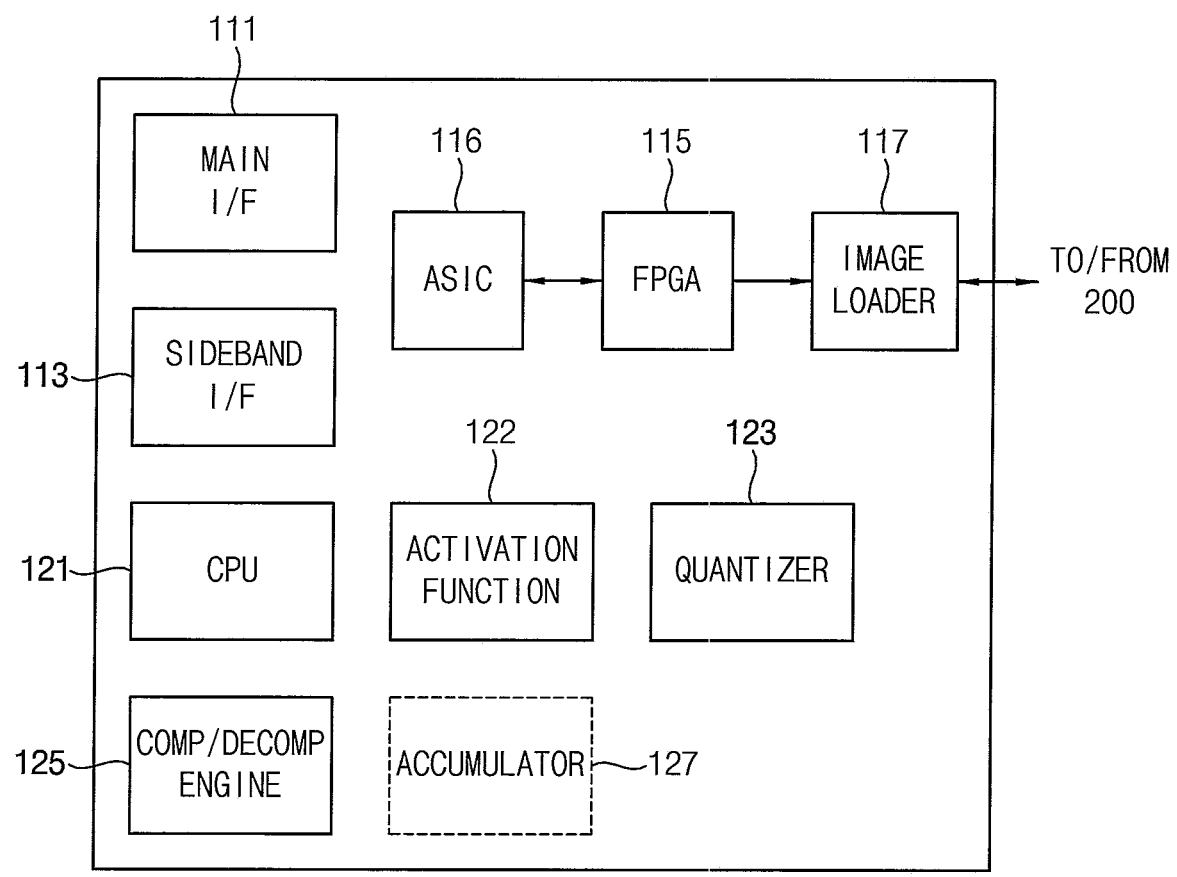
FIG. 2 is a block diagram illustrating an example configuration of the controller illustrated in FIG. 1.

FIG. 2 is a block diagram illustrating an example configuration of the controller illustrated in FIG. 1.

The controller 110 may further include an ASIC 116, an image loader 117, a central processing unit (CPU) 121, an activation function 122, a quantizer 123, and a compression/decompression engine 125. In exemplary embodiments, the controller 110 may further include an accumulator 127.

The CPU 121 may control overall operation of the controller 110. The activation function 122 may perform activation operation on the results of the multiplication operation provided from the systolic array package 200.

The quantizer 123 may quantize the weights and the input data to generate quantized weights and quantized input data and may provide the quantized weights and the quantized input data to the neuromorphic chips. In exemplary embodiments, the quantizer 123 may quantize the input data with a fixed point type into input data with fixed point type having less bits and may quantize the weights with a floating point type into weights with a fixed point type.

The compression/decompression engine 125 may perform decompression on the data provided from the host 20 and may perform compression on the data to be provided to the host 20. The accumulator 127 may perform accumulation operation to accumulate results of the multiplication operation provided from the systolic array package 200 and may provide a result of the accumulation operation to the activation function 122.

The main interface circuit 111, the sideband interface circuit 112, the CPU 121, the activation function 122 (also described as an activation function circuit), the quantizer 123, and the compression/decompression engine 125, etc., which are described above, may be manufactured and implemented, for example, as an application specific integrated circuit (ASIC) 116.

The FPGA 115 may be configured to implement at least some of functions of plural hardware intellectual properties cores (IPs) constituting the ASIC 116. For example, when updating a function of a specific hardware IP, it may be difficult (or, alternatively, impossible) to replace the specific hardware IP. In this case, a function of the specific hardware IP to be updated may be implemented by using the FPGA image received through the main interface MI or the sideband interface SBI from the host 20.

The image loader 117 (e.g., an image loading circuit) may load the FPGA image FIMG received from the host 20. For example, the FPGA image FIMG stored in the controller 110 may be loaded and executed in response to the request REQ received from the host 20.

In addition, the controller 110 may program embedded FPGAs included in the neuromorphic chips based on the FPGA image FIMG.

Figure 3:
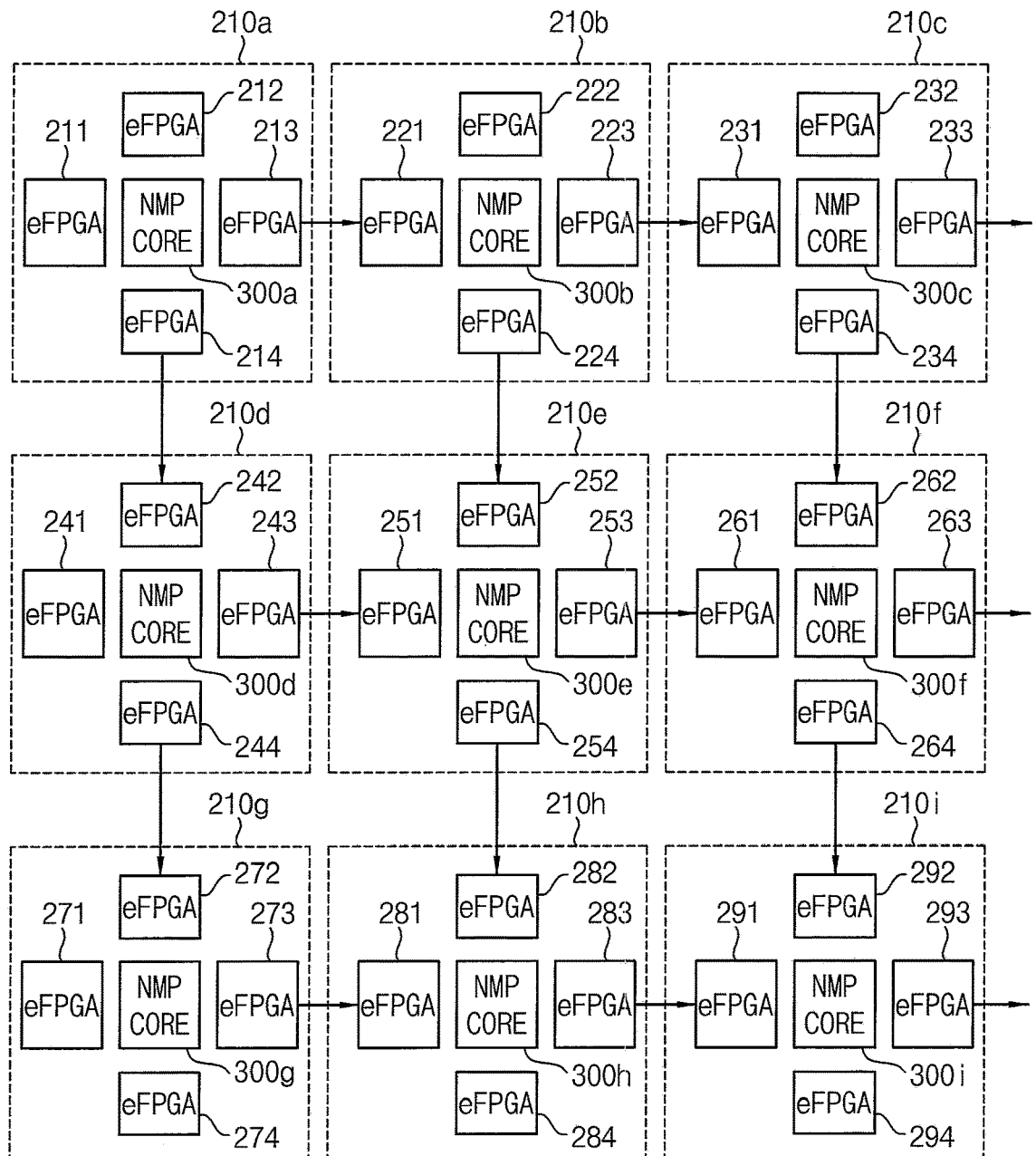
FIG. 3 is a block diagram illustrating an example of the systolic array package in the electronic device of FIG. 1 according to exemplary embodiments.

FIG. 3 is a block diagram illustrating an example of the systolic array package in the electronic device of FIG. 1 according to exemplary embodiments.

In FIG. 3, it is assumed that the systolic array package 200 in FIG. 1 is implemented in two dimensions.

Referring to FIG. 3, a systolic array package 200*a* includes a plurality of neuromorphic chips 210*a*~210*i* arranged in a systolic array along a first direction D1 and a second direction D2. Each of the neuromorphic chips 210*a*~210*i* may sequentially transfer weights of a plurality layers of a neural network system, in the first direction D1 to store the weights. A first neuromorphic chip of the plurality of neuromorphic chips 210*a*~210*i* may perform a calculation based on stored weights therein and an input data received in the second direction D2, and may provide a result of the calculation to at least one of a second neuromorphic chip and a third neuromorphic chip. The at least one of neuromorphic chip of the second neuromorphic chip and the third neuromorphic chip is configured to perform a calculation based on a provided result and weights stored therein. An example of such calculation is described in connection with FIGS. 6-17 below. The second neuromorphic chip is adjacent to the first neuromorphic chip in the first direction D1 and the third neuromorphic chip is adjacent to the first neuromorphic chip in the second direction D2. For example, the neuromorphic chip (a first neuromorphic chip) 210*a* may perform a calculation based on stored weights therein and an input data received in the second direction D2 and may provide a result of the calculation to at least one of the neuromorphic chip (a second neuromorphic chip) 210*b* and the neuromorphic chip (a third neuromorphic chip) 210*d*. The neuromorphic chip (the second neuromorphic chip) 210*b* may perform a calculation based on a provided result from the neuromorphic chip (the first neuromorphic chip) 210*a* and weights stored in the neuromorphic chip (the second neuromorphic chip) 210*b* to provide a result of the calculation to at least one of the neuromorphic chips 210*c* and 210*e*. Similarly, the neuromorphic chip (the third neuromorphic chip) 210*d* may perform a calculation based on a provided result from the neuromorphic chip (the first neuromorphic chip) 210*a* and weights stored in the neuromorphic chip (the third neuromorphic chip) 210*d* to provide a result of the calculation to at least one of the neuromorphic chips 210*e* and 210*g*.

The neuromorphic chip 210*a* includes a neuromorphic core 300*a* and embedded FPGAs 211~214 disposed adjacently to the neuromorphic core 300*a*. The neuromorphic chip 210*b* includes a neuromorphic core 300*b* and embedded FPGAs 221~224 disposed adjacently to the neuromorphic core 300*b*. The neuromorphic chip 210*c* includes a neuromorphic core 300*c* and embedded FPGAs 231~234 disposed adjacently to the neuromorphic core 300*c*. The neuromorphic chip 210*d* includes a neuromorphic core 300*d* and embedded FPGAs 241~244 disposed adjacently to the neuromorphic core 300*d*. The neuromorphic chip 210*e* includes a neuromorphic core 300*e* and embedded FPGAs 251~254 disposed adjacently to the neuromorphic core 300*e*. The neuromorphic chip 210*f* includes a neuromorphic core 300*f* and embedded FPGAs 261~264 disposed adjacently to the neuromorphic core 300*f*. The neuromorphic chip 210*g* includes a neuromorphic core 300*g* and embedded FPGAs 271~274 disposed adjacently to the neuromorphic core 300*g*. The neuromorphic chip 210*h* includes a neuromorphic core 300*h* and embedded FPGAs 281~284 disposed adjacently to the neuromorphic core 300*h*. The neuromorphic chip 210*i* includes a neuromorphic core 300*i* and embedded FPGAs 291~294 disposed adjacently to the neuromorphic core 300*i*.

In FIG. 3 the systolic array package 200*a* is illustrated as to include 9 neuromorphic chips, however, a number of neuromorphic chips included in the systolic array package 200*a* is not limited thereto.

The embedded FPGAs 211~214, 221~224, 231~234, 241~244, 251~254, 261~264, 271~274, 281~284 and 291~294 may use one of Peripheral Component Interconnect Express (PCIe) interface protocol, Cache Coherent Interconnect for accelerators (CCIX) interface protocol and Gen-Z interface protocol and the embedded FPGAs 211~214, 221~224, 231~234, 241~244, 251~254, 261~264, 271~274, 281~284 and 291~294 may perform one of a transmission operation and a reception operation. In addition, first embedded FPGAs of the embedded FPGAs 211~214, 221~224, 231~234, 241~244, 251~254, 261~264, 271~274, 281~284 and 291~294 to communicate with the outside of the systolic array package 200*a* and second embedded FPGAs of the embedded FPGAs 211~214, 221~224, 231~234, 241~244, 251~254, 261~264, 271~274, 281~284 and 291~294 to communicate with the adjacent neuromorphic cores use different interface protocols.

For example, with respect to the neuromorphic chip 210*d*, the embedded FPGA 241 communicates with the outside of the systolic array package and the embedded FPGAs 242~244 communicate with adjacent neuromorphic chips. The embedded FPGA 241 may use Gen-Z interface protocol and each of the embedded FPGAs 242~244 may use CCIX interface protocol. In addition, in some embodiments, the embedded FPGA 242 performs only the reception operation and the embedded FPGAs 243 and 244 performs only the transmission operation.

According to certain embodiments, since the embedded FPGAs 211~214, 221~224, 231~234, 241~244, 251~254, 261~264, 271~274, 281~284 and 291~294 perform one of a transmission operation and a reception operation, the neuromorphic chips 210*a*~210*i* sequentially perform the calculation based on the weights and the input data and provide results of the calculation to adjacent neuromorphic chips.

Figure 4:
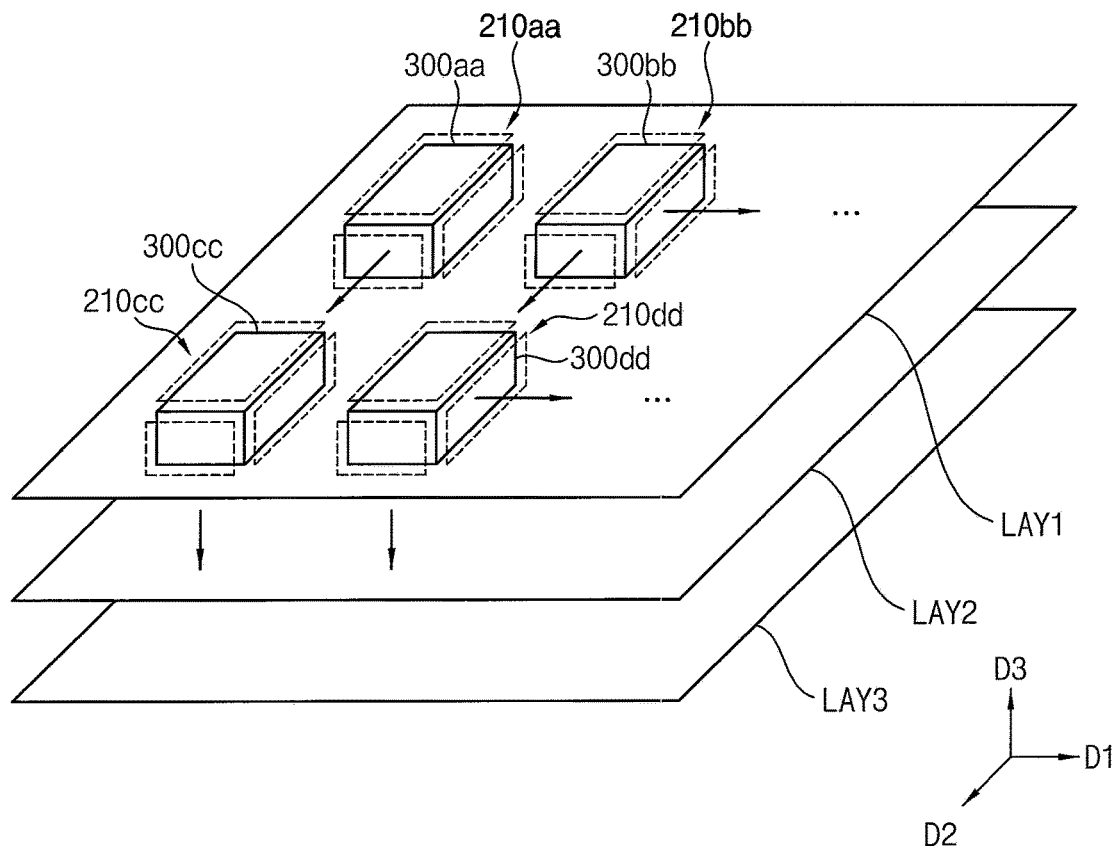
FIG. 4 is a block diagram illustrating an example of the systolic array package in the electronic device of FIG. 1 according to exemplary embodiments.

FIG. 4 is a block diagram illustrating an example of the systolic array package in the electronic device of FIG. 1 according to exemplary embodiments.

In FIG. 4, it is assumed that the systolic array package 200 in FIG. 1 is implemented in three dimensions.

Referring to FIG. 4, a systolic array package 200*b* includes a plurality of neuromorphic chips which are arranged in two dimensions along the first direction D1 and the second direction D2 in each of a plurality of physical layers LAY1~LAY3 and the plurality of physical layers LAY1~LKY3 are stacked in a third direction D3 perpendicular to the first direction D1 and the second direction D2.

In FIG. 4, a plurality of neuromorphic chips 210*aa*, 210*bb*, 210*cc* and 210*dd* are arranged in the physical layer LAY1. Each of the neuromorphic chips 210*aa*, 210*bb*, 210*cc* and 210*dd* may include respective one of neuromorphic cores 300*aa*, 300*bb*, 300*cc* and 300*dd* and a plurality of embedded FPGAs disposed adjacently to the respective one of neuromorphic cores 300*aa*, 300*bb*, 300*cc* and 300*dd*.

Figure 5:
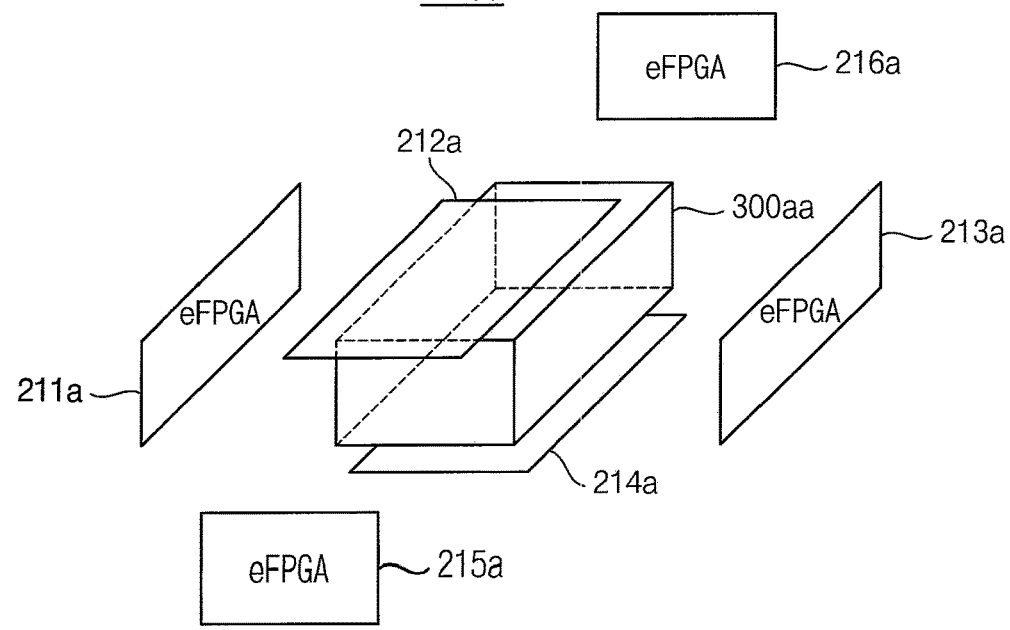
FIG. 5 illustrates one of the neuromorphic chips arranged in a first physical layer in FIG. 4.

FIG. 5 illustrates one of the neuromorphic chips arranged in a first physical layer in FIG. 4.

Referring to FIG. 5, the neuromorphic chip 210*aa* includes the neuromorphic core 300*aa* and embedded FPGAs 211*a*~216*a* disposed adjacently to the neuromorphic core 300*aa*. Each of the embedded FPGAs 211*a*~216*a* may perform only one of the transmission operation and the reception operation, some of the embedded FPGAs 211*a*~216*a* communicate with the outside and other of the embedded FPGAs 211*a*~216*a* communicate with adjacent neuromorphic chips. Description in the embedded FPGAs with reference to FIG. 3 may be similarly applied to the embedded FPGAs 211*a*~216*a*.

Figure 6:
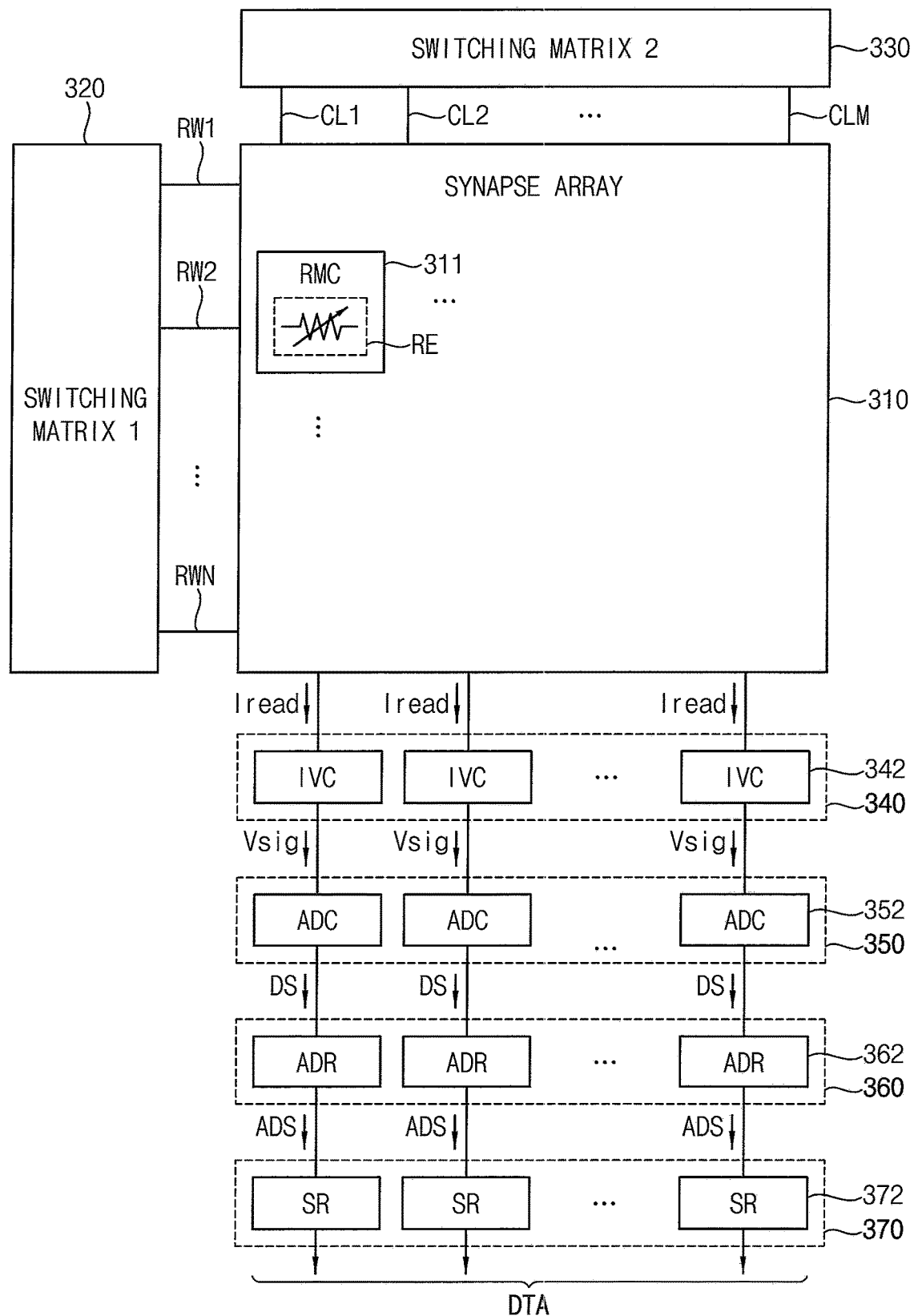
FIG. 6 is a block diagram illustrating one of neuromorphic cores in the systolic array package in FIG. 3 or FIG. 4 according to exemplary embodiments.

FIG. 6 is a block diagram illustrating one of neuromorphic cores in the systolic array package in FIG. 3 or FIG. 4 according to exemplary embodiments.

Referring to FIG. 6, a neuromorphic core 301 may include a synapse array 310 and an analog-to-digital conversion block 350. The neuromorphic core 301 may further include a first switching matrix 320, a second switching matrix 330, a current-to-voltage conversion block 340, an adder block 360 and a shift register block 370. Each of the synapse array 310, the analog-to-digital conversion block 350, the first switching matrix 320, the second switching matrix 330, the current-to-voltage conversion block 340, the adder block 360, and the shift register block 370, or portions thereof may be formed of various circuit elements and may be referred to as a circuit (e.g., a synapse array circuit, analog-to-digital conversion circuit, switching circuit, etc.).

The synapse array 310 includes a plurality of resistive memory cells RMC that are arranged in a matrix formation. Each of the plurality of resistive memory cells RMC includes a resistive element RE. Each of the plurality of resistive memory cells RMC may correspond to a synapse 311.

Each of the plurality of resistive memory cells RMC may be connected to a respective one of a plurality of row lines RW1, RW2, ..., RWN and a respective one of a plurality of column lines CL1, CL2, ..., CLM, where each of N and M is a natural number greater than or equal to two. Detailed configurations of the synapse array 310 will be described with reference to FIGS. 8A and 8B.

The synapse array 310 stores a plurality of data (weights). For example, the plurality of data may be stored in the plurality of resistive memory cells RMC by using a resistance change of the resistive element RE included in each of the plurality of resistive memory cells RMC. The synapse array 310 generates a plurality of read currents Iread corresponding to a plurality of signal voltages Vsig based on a plurality of input voltages and the plurality of data. For example, the plurality of input voltages may be input to the synapse array 310 through the plurality of row lines RW1, RW2, ..., RWN.

In some exemplary embodiments, as will be described with reference to FIGS. 7A and 7B, the neuromorphic core 301 may be used to drive at least one of various neural network systems and/or machine learning systems, e.g., an artificial neural network (ANN) system, a convolutional neural network (CNN) system, a deep neural network (DNN) system, a deep learning system, or the like.

For example, at least one of various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by the neuromorphic core 301. In this example, the plurality of data stored in the synapse array 310 may correspond to a plurality of weights include in a plurality of layers of a neural network system, and the plurality of read currents Tread and the plurality of signal voltages Vsig may represent a result of multiplication and accumulation operations performed by the neural network system. In some embodiments, the synapse array 310 may perform a data storage operation and a data computation (or calculation) operation at once, which will be described with reference to FIG. 8B.

The first switching matrix 320 may be connected to the plurality of row lines RW1, RW2, ..., RWN of the synapse array 310. Although not illustrated in detail, the first switching matrix 320 may drive the plurality of row lines RW1, RW2, ..., RWN based on row selection signals for selecting at least one of the plurality of row lines RW1, RW2, ..., RWN and/or row driving voltages for driving at least one of the plurality of row lines RW1, RW2, ..., RWN.

The second switching matrix 330 may be connected to the plurality of column lines CL1, CL2, ..., CLM of the synapse array 310. Although not illustrated in detail, the second switching matrix 130 may drive the plurality of column lines CL1, CL2, ..., CLM based on column selection signals for selecting at least one of the plurality of column lines CL1, CL2, ..., CLM and/or column driving voltages for driving at least one of the plurality of column lines CL1, CL2, ..., CLM.

The current-to-voltage conversion block 340 may include a plurality of current-to-voltage converters (IVCs) 342. The plurality of current-to-voltage converters 342 may convert the plurality of read currents Tread into the plurality of signal voltages Vsig. For example, each of the plurality of current-to-voltage converters 342 may include a current mirror.

The analog-to-digital conversion block 350 includes a plurality of analog-to-digital converters (ADCs) 352. The plurality of analog-to-digital converters 352 convert the plurality of signal voltages Vsig into a plurality of digital signals DS.

The adder block 360 may include a plurality of adders (ADRs) 362. The plurality of adders 362 may sum the plurality of digital signals DS to generate a plurality of summed digital signals ADS.

The shift register block 370 may include a plurality of shift registers (SRs) 372. The plurality of shift registers 372 may generate final data DTA based on an output of the plurality of adders 362 (e.g., based on the plurality of summed digital signals ADS). The final data DTA may correspond to a final result of the multiplication and accumulation operations performed by the neural network system.

In an example of FIG. 6, the number of the plurality of current-to-voltage converters 342, the number of the plurality of analog-to-digital converters 352, the number of the plurality of adders 362 and the number of the plurality of shift registers 372 may be substantially equal to the number of the plurality of columns CL1, CL2, ..., CLM of the synapse array 310.

Although not illustrated in FIG. 6, the neuromorphic core 301 may further include a timing controller or a control circuit that generates control signals for controlling operation timings of the first switching matrix 320, the second switching matrix 330, the current-to-voltage conversion block 340, the analog-to-digital conversion block 350, the adder block 360, the shift register block 370, etc., and/or may further include a voltage regulator that generates the row driving voltages, the column driving voltages, the reference voltage, etc.

Typically, the plurality of resistive memory cells RMC included in the synapse array 310 have temperature and time dependency. For example, the resistive element RE included in each of the plurality of resistive memory cells RMC may have a temperature dependency in which a resistance decreases as a temperature increases and the resistance increases as the temperature decreases. In addition, the resistive element RE may have a time dependency including a retention characteristic in which the resistance decreases as time goes on, a drift characteristic in which the resistance increases when a predetermined time elapses after a data write operation, or the like. Thus, the read current Tread output from the synapse array 310 may be changed depending on temperature and time. To store accurate data and perform computation or calculation without errors, it may be necessary to reduce or eliminate such temperature and time dependency.

The neuromorphic core 301 according to exemplary embodiments may include the analog-to-digital converter 352 that includes the at least one resistive memory element RME including the same resistive material as the resistive element RE included in the synapse array 310. In the neuromorphic core die 301 according to exemplary embodiments, the read current Tread output from the synapse array 310, the signal voltage Vsig corresponding to the read current Tread and the voltage used in the analog-to-digital converter 352 may have the same temperature and time dependency. Thus, when the output of the synapse array 310 is analog-to-digital converted, the constant digital signal DS which is not changed depending on temperature and time may be generated. Accordingly, the analog-to-digital conversion and the data computation may be efficiently performed without errors.

Figure 7A:
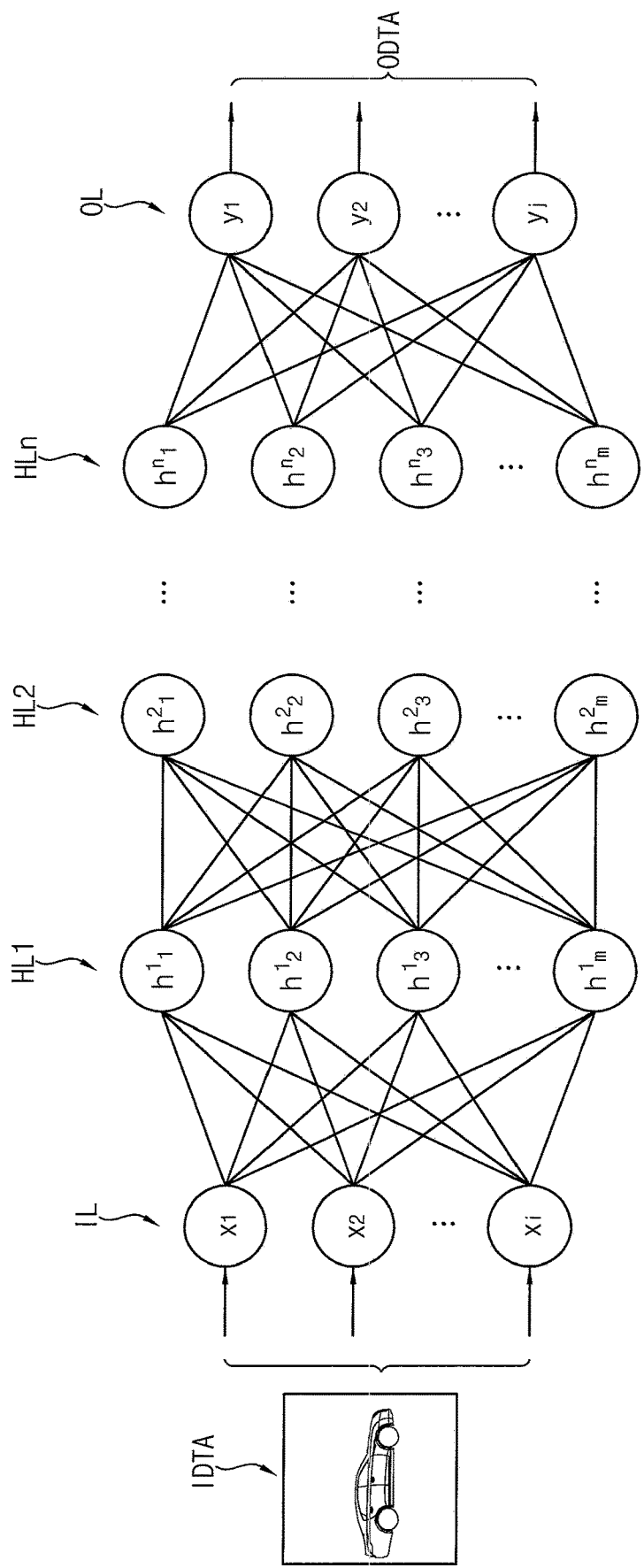
FIGS. 7A and 7B are diagrams for describing an example of a neural network system that is driven by a neuromorphic core die according to exemplary embodiments.
Figure 7B:
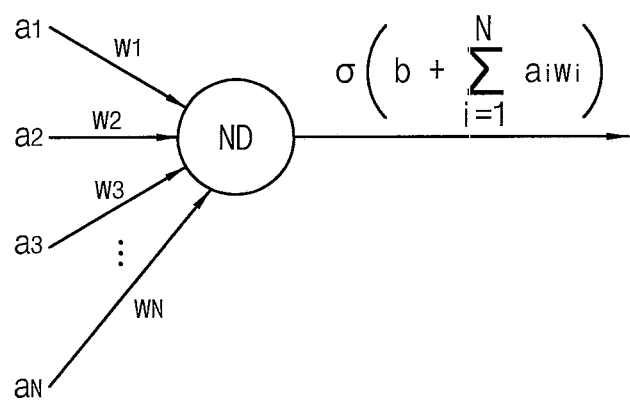

FIGS. 7A and 7B are diagrams for describing an example of a neural network system that is driven by a neuromorphic core die according to exemplary embodiments.

Referring to FIG. 7A, a general neural network may include an input layer IL, a plurality of hidden layers HL1, HL2, ..., HLn and an output layer OL.

The input layer IL may include i input nodes $x_1, x_2, \ldots, x_i$, where i is a natural number. Input data (e.g., vector input data) IDTA whose length is i may be input to the input nodes $x_1, x_2, \ldots, x_i$ such that each element of the input data IDTA is input to a respective one of the input nodes $x_1, x_2, \ldots, x_i$.

The plurality of hidden layers HL1, HL2, ..., HLn may include n hidden layers, where n is a natural number, and may include a plurality of hidden nodes $h^1_1, h^2_1, h^1_3, \ldots, h^1_m, h^2_1, h^2_2, h^2_3, \ldots, h^2_m, h^n_1, h^n_2, h^n_3, \ldots, h^n_m$. For example, the hidden layer HL1 may include m hidden nodes $h^1_1, h^1_2, h^1_3, \ldots, h^1_m$, the hidden layer HL2 may include m hidden nodes $h^2_1, h^2_2, h^2_3, \ldots, h^2_m$, and the hidden layer HLn may include m hidden nodes $h^n_1, h^n_2, h^n_3, \ldots, h^n_m$, where m is a natural number.

The output layer OL may include j output nodes $y_1, y_2, \ldots, y_j$, where j is a natural number. Each of the output nodes $y_1, y_2, \ldots, y_j$ may correspond to a respective one of classes to be categorized. The output layer OL may output output values (e.g., class scores or simply scores) or output data ODTA associated with the input data IDTA for each of the classes. The output layer OL may be referred to as a fully-connected layer and may indicate, for example, a probability that the input data IDTA corresponds to a car.

A structure of the neural network illustrated in FIG. 7A may be represented by information on branches (or connections) between nodes illustrated as lines, and a weighted value assigned to each branch, which is not illustrated. Nodes within one layer may not be connected to one another, but nodes of different layers may be fully or partially connected to one another.

Each node (e.g., the node $h^1_1$) may receive an output of a previous node (e.g., the node $x_1$), may perform a computing operation, computation or calculation on the received output, and may output a result of the computing operation, computation or calculation as an output to a next node (e.g., the node $h^2_1$). Each node may calculate a value to be output by applying the input to a specific function, e.g., a nonlinear function.

Generally, the structure of the neural network is set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

Referring to FIG. 7B, an example of an operation performed by one node ND included in the neural network of FIG. 7A is illustrated in detail.

When N inputs $a_1, a_2, a_3, \ldots, a_N$ are provided to the node ND, the node ND may multiply the N inputs $a_1, a_2, a_3, \ldots, a_N$ and corresponding N weights $w_1, w_2, w_3, \ldots, w_N$, respectively, may sums N values obtained by the multiplication, may add an offset "b" to a summed value, and may generate one output value (e.g., "z") by applying a value to which the offset "b" is added to a specific function "σ".

When one layer included in the neural network illustrated in FIG. 2A includes M nodes ND illustrated in FIG. 2B, output values of the one layer may be obtained by Equation 1.

$$W*A=Z \qquad \text{[Equation 1]}$$

In Equation 1, "W" represents weights for all connections included in the one layer, and may be implemented in an M*N matrix form. "A" represents the N inputs $a_1, a_2, a_3, \ldots, a_N$ received by the one layer, and may be implemented in an N*1 matrix form. "Z" represents M outputs $z_1, z_2, z_3, \ldots, z_M$ output from the one layer, and may be implemented in an M*1 matrix form.

Figure 8A:
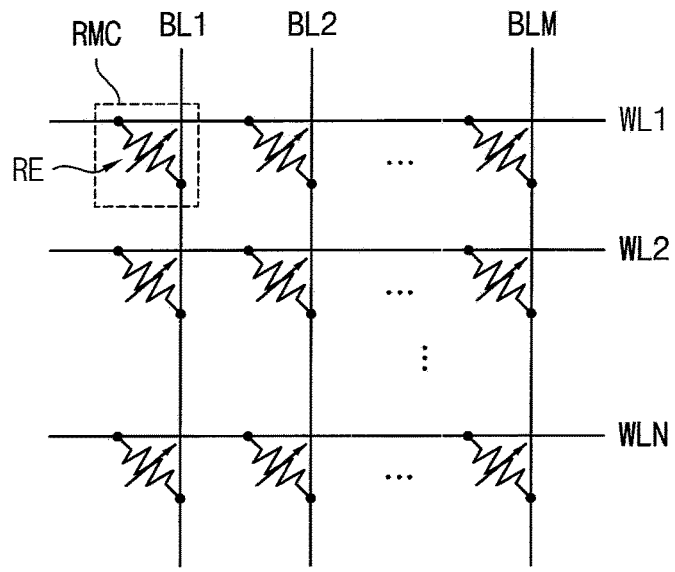
FIGS. 8A and 8B are diagrams illustrating examples of a synapse array included in the neuromorphic core in FIG. 6 according to exemplary embodiments.
Figure 8B:
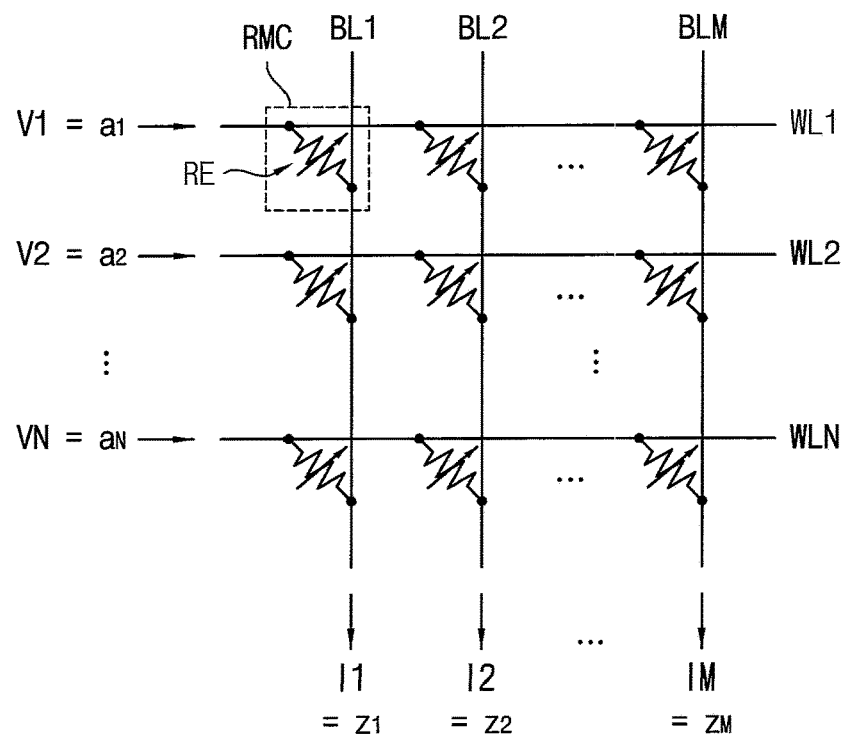

FIGS. 8A and 8B are diagrams illustrating examples of a synapse array included in the neuromorphic core in FIG. 6 according to exemplary embodiments.

Referring to FIG. 8A, a synapse array 310a includes a plurality of word-lines WL1, WL2, ..., WLN, a plurality of bit-lines BL1, BL2, ..., BLM, and a plurality of resistive memory cells RMC.

The plurality of word-lines WL1, WL2, ..., WLN in FIG. 8A may correspond to the plurality of row lines RW1, RW2, ..., RWN in FIG. 6, the plurality of bit-lines BL1, BL2, ..., BLM in FIG. 8A may correspond to the plurality of column lines CL1, CL2, ..., CLM in FIG. 6, and the plurality of resistive memory cells RMC in FIG. 8A may correspond to the plurality of resistive memory cells RMC in FIG. 6. Each of the plurality of resistive memory cells RMC may include a resistive element RE, and may be connected to a respective one of the plurality of word-lines WL1, WL2, ..., WLN and a respective one of the plurality of bit-lines BL1, BL2, ..., BLM.

A resistance of the resistive element RE may be changed based on a write voltage applied through the plurality of word-lines WL1, WL2, ..., WLN or the plurality of bit-lines BL1, BL2, ..., BLM, and the plurality of resistive memory cells RMC may store a plurality of data by the resistance change of the resistive element RE. For example, when the write voltage is applied to a selected word-line and a ground voltage (e.g., about 0V) is applied to a selected bit-line, data '1' may be written into a selected resistive memory cell. When the ground voltage is applied to the selected word-line and the write voltage is applied to the selected bit-line, data '0' may be written into the selected resistive memory cell. Further, when a read voltage is applied to the selected word-line and the ground voltage is applied to the selected bit-line, data written in the selected resistive memory cell may be read or retrieved.

In some exemplary embodiments, each of the plurality of resistive memory cells RMC may include one of various resistive memory cells, e.g., a phase change random access memory (PRAM) cell, a resistance random access memory (RRAM) cell, a magnetic random access memory (MRAM) cell, a ferroelectric random access memory (FRAM) cell, or the like.

In some exemplary embodiments, the resistive element RE may include a phase change material that changes its crystalline state depending on an amount of a current. In other exemplary embodiments, the resistive element RE may include a perovskite compound, a transition metal oxide, a magnetic material, a ferromagnetic material, or an anti-ferromagnetic material, instead of the phase change material. However, the materials included in the resistive element RE are not limited thereto.

Referring to FIG. 8B, an example in which the synapse array 310a of FIG. 9A performs the operation described with reference to FIGS. 7A and 7B is illustrated.

Each resistive memory cell RMC may correspond to one synapse or connection in the neural network system and may store one weight (e.g., weight value). Thus, M*N data stored in the synapse array 310a may correspond to a weight matrix that includes the weights included in the one layer described with reference to FIGS. 7A and 7B. For example, the M*N data may correspond to "W" that is implemented in the M*N matrix form in Equation 1.

N input voltages V1, V2, . . . , VN applied through the plurality of word-lines WL1, WL2, . . . , WLN may correspond to an input matrix that includes the N inputs $a_1$, $a_2$, $a_3$, . . . , $a_N$ received by the one layer described with reference to FIGS. 8A and 8B. For example, the N input voltages V1, V2, . . . , VN may correspond to "A" that is implemented in the N*1 matrix form in Equation 1.

M read currents I1, I2, . . . , IM output through the plurality of bit-lines BL1, BL2, . . . , BLM may correspond to an output matrix that includes the M outputs $z_1$, $z_2$, $z_3$, . . . , $z_M$ output from the one layer described with reference to FIGS. 8A and 8B. For example, the M read currents I1, I2, . . . , IM may correspond to "Z" that is implemented in the M*1 matrix form in Equation 1.

In summary, when the synapse array 310a is implemented by storing the plurality of weights having a matrix form in the plurality of resistive memory cells RMC, and when the input voltages V1, V2, . . . , VN corresponding to the plurality of inputs are provided through the plurality of word-lines WL1, WL2, . . . , WLN, the read currents I1, I2, . . . , IM output through the plurality of bit-lines BL1, BL2, . . . , BLM may correspond to the result of the multiplication and accumulation operations performed by the neural network system. By implementing the plurality of layers in the neural network system in this manner, the neuromorphic computing chip that performs the data storage and computation (or calculation) operations at once may be formed.

Although the crossbar array 310a having a two-dimensional (2D) array structure are illustrated in FIGS. 8A and 8B, exemplary embodiments are not limited thereto, and a synapse array may be formed in a three-dimensional (3D) or vertical array structure. In addition, a configuration of the resistive memory cells RMC may be changed according to exemplary embodiments.

Figure 9:
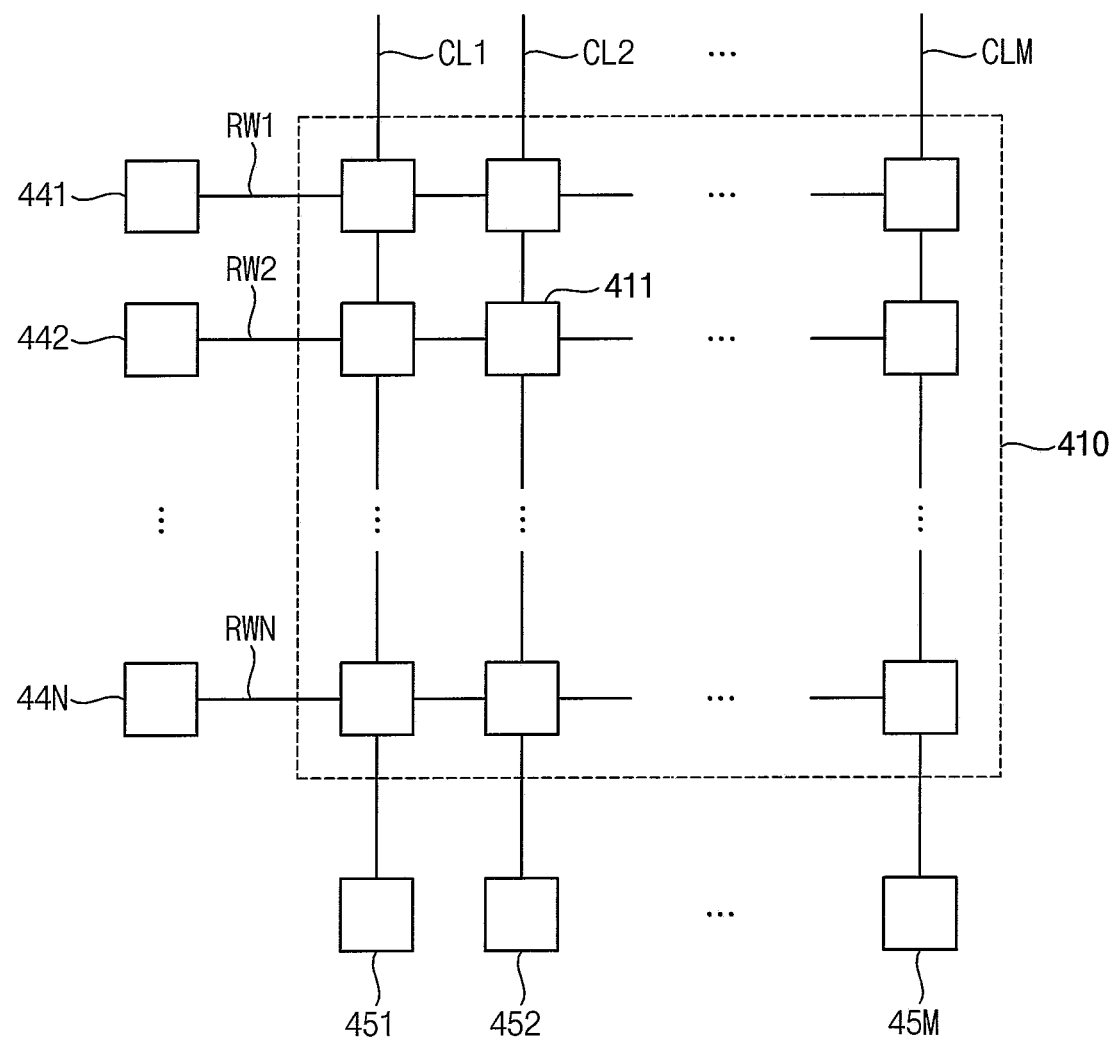
FIG. 9 is a block diagram illustrating one of the neuromorphic cores in the systolic array package in FIG. 3 or FIG. 4 according to exemplary embodiments.

FIG. 9 is a block diagram illustrating one of the neuromorphic cores in the systolic array package in FIG. 3 or FIG. 4 according to exemplary embodiments.

Referring to FIG. 9, a neuromorphic core die 401 may include a synapse array 410, a plurality of first neurons 441, 442, . . . , 44N and a plurality of second neurons 451, 452, . . . , 45M. Each of the first neurons 441, 442, . . . , 44N may be referred to as a pre-synaptic neuron and each of the second neurons 451, 452, . . . , 45M may be referred to as a post-synaptic neuron.

The synapse array 410 includes a plurality of synapses 411, the synapse array 410 are connected to the first neurons 441, 442, . . . , 44N through a plurality of row lines RW1, RW2, . . . , RWN and the synapse array 410 are connected to the second neurons 451, 452, . . . , 45M through a plurality of column lines CL1, CL2, . . . , CLM.

The synapse array 410 may store weights included in a plurality of layers of a neural network system and may perform operation based on the weights and the input data.

Figure 10:
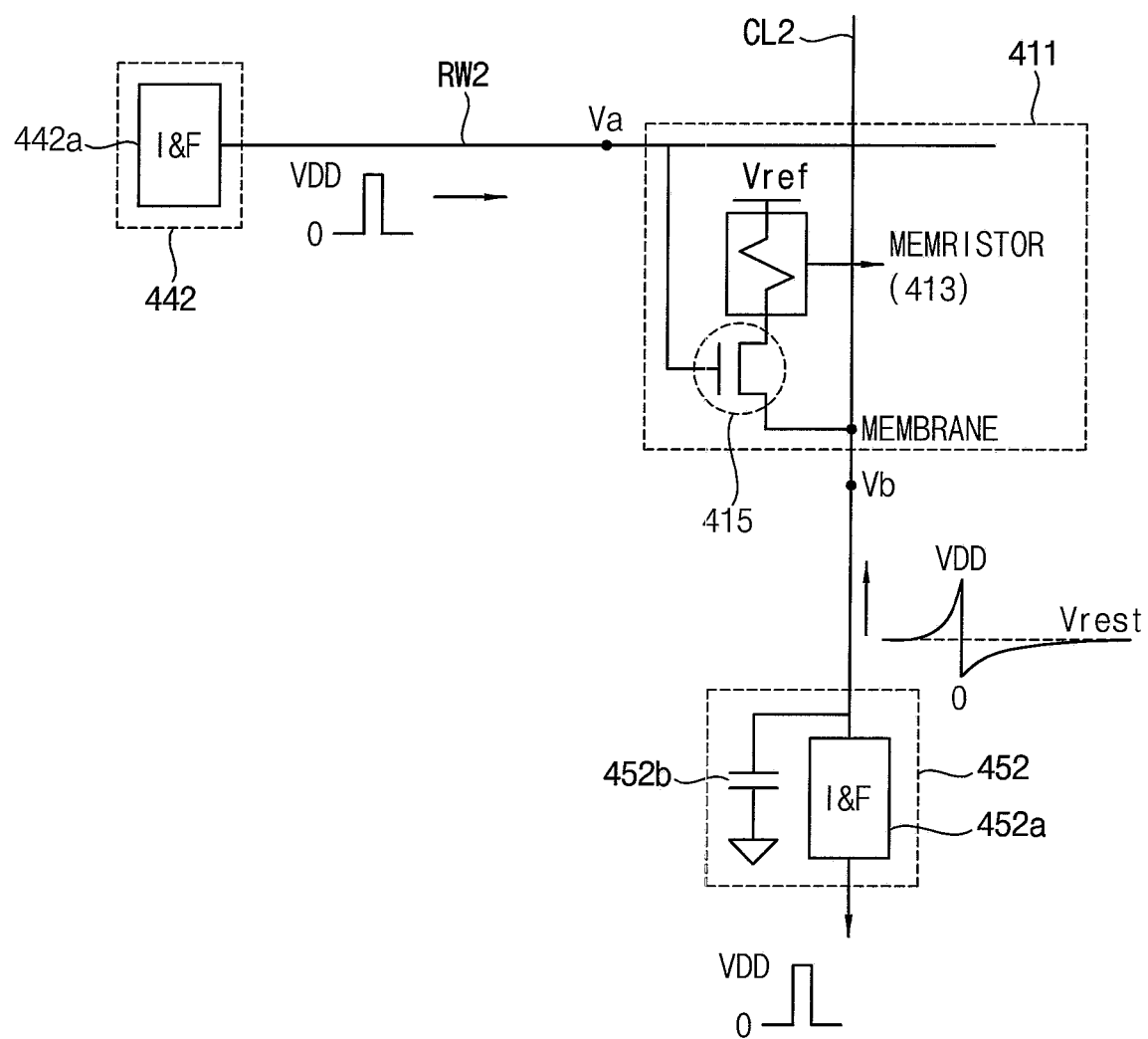
FIG. 10 illustrates a relationship of one of the synapses, a corresponding first neuron and a corresponding second neuron in FIG. 9 according to exemplary embodiments.

FIG. 10 illustrates a relationship of one of the synapses, a corresponding first neuron and a corresponding second neuron in FIG. 9 according to exemplary embodiments.

In FIG. 10, a synapse 411, a first neuron 442 connected to the synapse 411 through the row line RW2 and a second neuron 452 connected to the synapse 411 through the column line CL2.

Referring to FIG. 10, the synapse 411 is connected to the first neuron 442 through the row line RW2 and is connected to the second neuron 452 through the column line CL2.

The synapse 411 includes a memristor 413 whose resistance value may be changed. The synapse 411 also includes a transistor 415 that is connected to the memristor 413. The transistor 415 receives at least two input signals. The resistance value of the memristor 413 may be changed based on a difference in input time of the at least two input signals that are applied to the transistor 415.

For example, the resistance value of the memristor 413 may be changed according to a voltage change due to the input time difference of the input signals. For example, the resistance value of the memristor 413 may be changed according to a voltage change due to an input time difference between a first input signal and a second input signal. The first input signal may be a signal applied to a gate terminal of the transistor 415. The second input signal may be a signal based on a membrane voltage applied to a source terminal of the transistor 415. The first input signal may be transmitted from the first neuron 442, and the second input signal may be transmitted from the second neuron circuit 452.

A direction of the current flowing on the memristor 413 may be determined based on a difference in voltage caused by the input time difference between the first input signal and the second input signal. For example, in response to the first input signal being input to the transistor 415 earlier than the second input signal, the current may flow in a direction from the transistor 415 to the memristor 413. When the input signal is input to the transistor 415 later than the second input signal, conversely, the current may flow in a direction from memristor 413 to the transistor 415.

The direction and amount of the current flowing on the memristor 413 may be determined based on the voltage difference caused by the input time difference between the first input signal and the second input signal. For example, in response to the time difference between the first input signal and the second signal being sufficiently large such that the first input signal and the second input signal hardly influence each other, the transistor 415 is in an on state during input of the first input signal and when Vref>Vrest is satisfied. Therefore, the current flows in the direction from the memristor 413 to the transistor 415. In this case, since a voltage difference Vref−Vrest between opposite ends of the memristor 413 is smaller than a threshold voltage for changing characteristics of the memristor 413, the memristor 413 may stay in a high resistance state (HRS) and only a minor current of approximate zero flows on the memristor 413.

In the event that the input time difference between the first input signal and the second input signal is relatively small such that the input signals may influence each other, and in the event that the first input signal is input a bit earlier than the second input signal, the transistor 415 may be in the on state during input of the first input signal, and a voltage Vb of a source of the transistor 415 satisfies Vb>Vref. Therefore, the current flows in the direction from the transistor 415 to the memristor 413. Here, in the event that the voltage difference Vb−Vref between the opposite ends of the memristor 413 is larger than the threshold voltage for changing characteristics of the memristor 413, the memristor 413 may stay in a low resistance state (LRS). When the memristor 413 is in the LRS, a relatively large amount of current may flow on the memristor 413. Otherwise, the memristor 413 may still stay in the HRS.

In the event that the input time difference between the first input signal and the second input signal is relatively small such that the input signals may influence each other, and in the event that the first input signal is input similar to or a bit later than the second input signal, the transistor 415 may be in the on state during input of the first signal, and the voltage Vb of the source of the transistor 415 satisfies Vb<Vref. The current may flow in the direction from the memristor 413 to the transistor 415. In the event that the voltage difference Vref−Vb between the opposite ends of the memristor 413 is larger than the threshold voltage for changing characteristics of the memristor 413, the memristor 413 may stay in the HRS again. In this case, a relatively small amount of current flows in the memristor 413. Otherwise, the memristor 413 may still stay in the LRS.

In the event that the first input signal is provided much later than the second input signal, the input time difference is increased. Therefore, the input signals may not influence each other. In addition, since Vref>Vrest is satisfied, the current may flow in the direction from the memristor 413 to the transistor 415. Because the voltage difference Vref−Vrest between the opposite ends of the memristor 413 is smaller than the threshold voltage for changing characteristics of the memristor 4113, the memristor 413 may stay in the HRS.

One end of the memristor 413 may be connected to a drain terminal of the transistor 415 while the other end is connected to a voltage source to apply a reference voltage Vref. A channel of the memristor 413 may be serially connected to a channel of the transistor 415. Different voltages may be applied to the memristor 413 and the source terminal of the transistor 415. The transistor 415 connected to the memristor 413 may be an n-channel metal-oxide semiconductor (NMOS) transistor.

The synapse 411 may further include a first terminal connected to the gate terminal of the transistor 415 to provide the first input signal, and a second terminal connected to the source terminal of the transistor 415 to provide the second input signal. The synapse 411 may be connected to the first neuron 442 through the first terminal, and may be connected to the second neuron 454 through the second terminal. A first voltage Va may be supplied from the first neuron 442 through the first terminal. A second voltage Vb may be supplied from the second neuron 454 through the second terminal.

For example, the first neuron 442 and the second neuron 454 may each include an integrate-and-fire (I&F) neuron 442a and 452a for firing a spike or a pulse. The first neuron 442 and the second neuron 454 may fire the spike or the pulse in response to an amount of a current received through the synapse 411 exceeding a predetermined threshold.

The second neuron 452 may generate a spike that fires with reference to the resting voltage Vrest. The second neuron 452 may further include a capacitor 452b.

Figure 11:
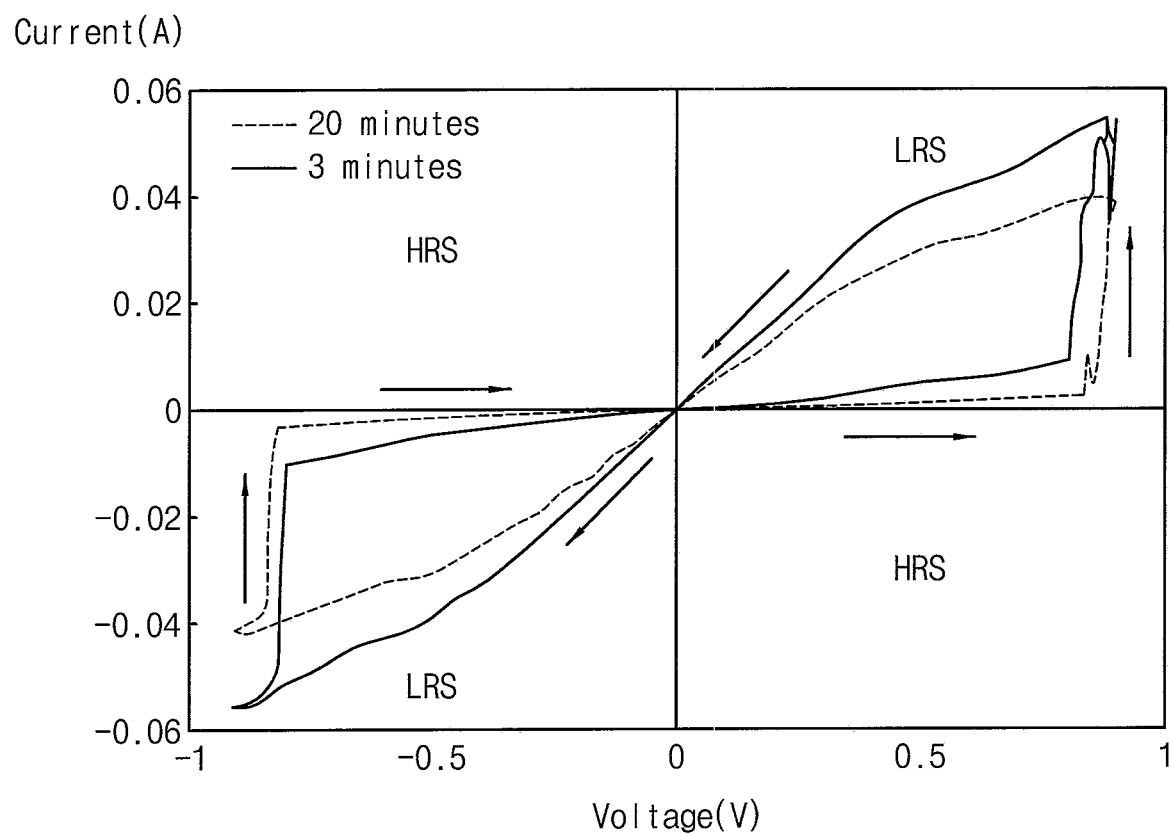
FIG. 11 illustrates an example of operational characteristics of the memristor included in the synapse in FIG. 10.

A configuration of FIG. 11 is for operation of spike-timing dependent plasticity (STDP).

FIG. 11 illustrates an example of operational characteristics of the memristor included in the synapse in FIG. 10.

Figure 12:
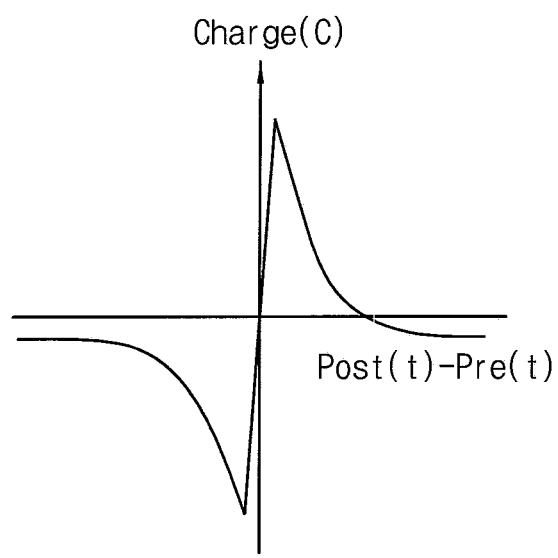
FIGS. 12 and 13 are a graph illustrating the change in the amount of current flowing between the first neuron and the second neuron and a graph illustrating relationships between a spike generation time difference in general STDP operation and variations of a synaptic weight, respectively.

According to the operational characteristics of the memristor illustrated in FIG. 12, the memristor refers to a passive device capable of remembering an amount of a current that has been passed. The memristor remembers a charge amount and a resistance of the memristor may be changed according to the charge amount. In this case, the resistance of the memristor may be changed according to a flow and amount of current.

Referring to a graph of FIG. 11, it is demonstrated that almost no current flows when a voltage supplied to the memristor does not reach about ±8V. However, in response to the supplied voltage exceeding about ±8V, the amount of current flowing on the memristor suddenly increases. A voltage of a spot at which the current amount suddenly changes may be understood as a threshold voltage, which corresponds to ±8V in FIG. 11.

The state in which the voltage supplied to the memristor does not reach the threshold voltage and therefore almost no current flows may be referred to as the HRS. The state in which the voltage supplied to the memristor exceeds the threshold voltage and therefore the current amount is suddenly increased may be referred to as the LRS.

Figure 13:
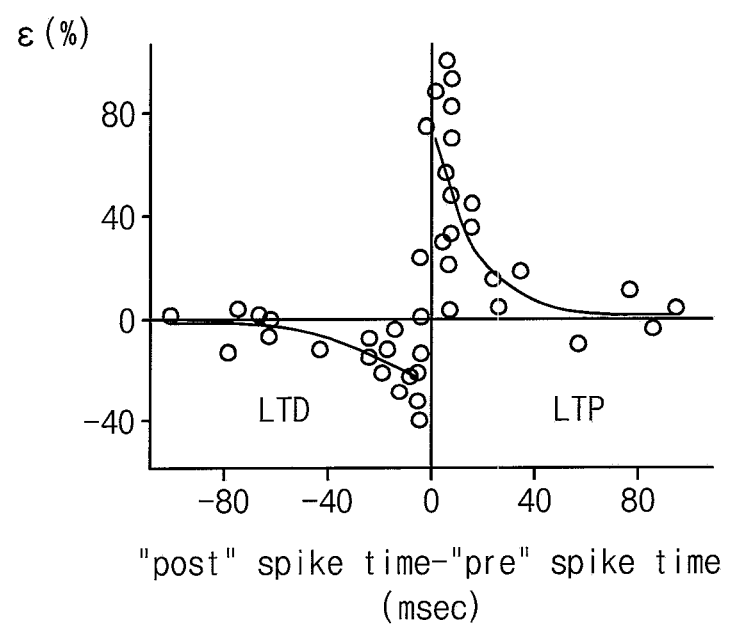

FIGS. 12 and 13 are a graph illustrating the change in the amount of current flowing between the first neuron and the second neuron and a graph illustrating relationships between a spike generation time difference in general STDP operation and variations of a synaptic weight, respectively.

The generation of the post-synaptic spike and the pre-synaptic pulse and the characteristics of the current flowing during the generation are illustrated in FIG. 12. The relationships between a pulse generation time difference in the STDP operation and the variations of the synaptic weight show characteristics very similar to a graph of FIG. 13.

When the spike fired in the foregoing neuron circuits is modeled into an electrical waveform, the synaptic weight variations may be expressed by a subtraction between a waveform related to the pulse fired in the pre-synaptic neuron circuit (hereinafter, referred to as 'pre-synaptic pulse') and a waveform related to the spike fired in the post-synaptic neuron circuit (hereinafter, referred to as 'post-synaptic spike').

Figure 14:
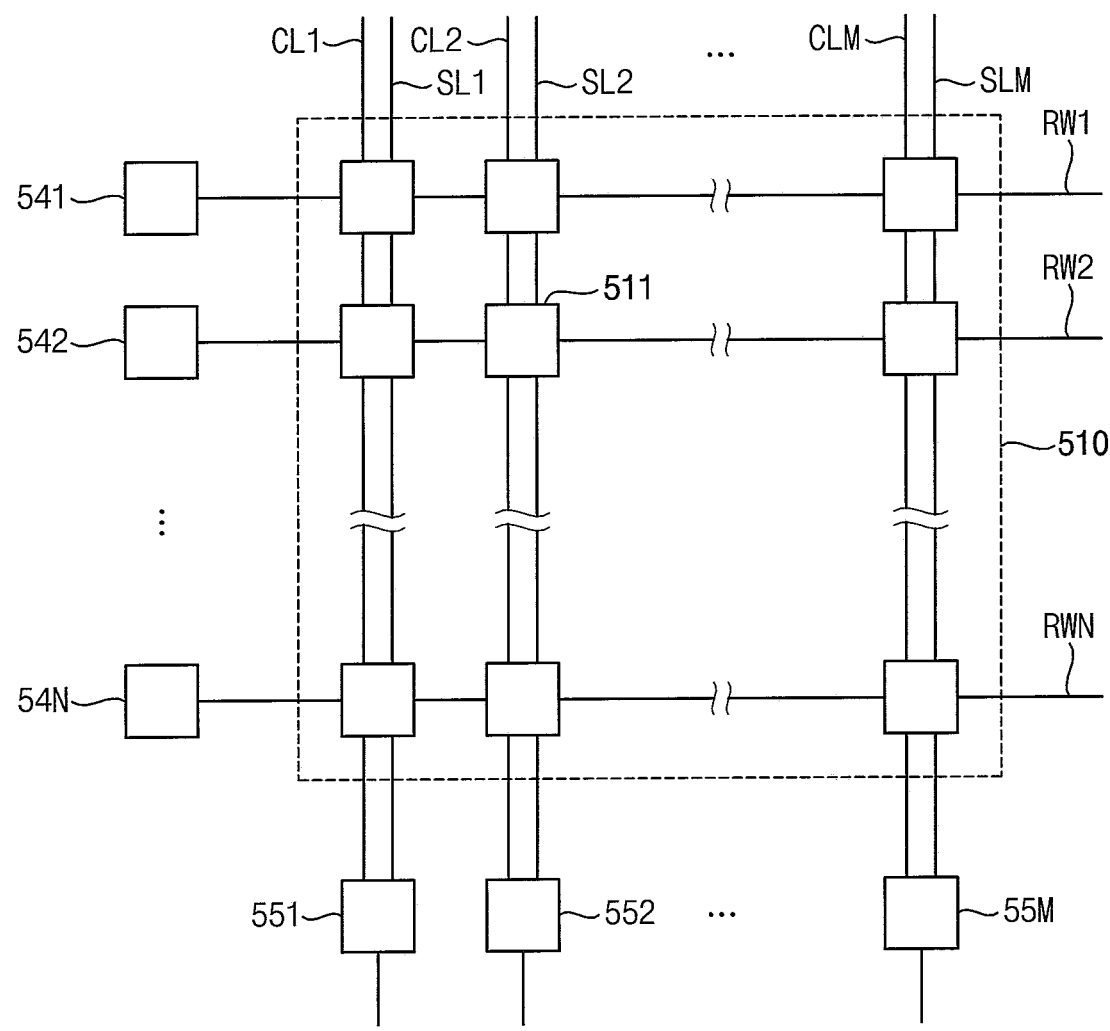
FIG. 14 is a block diagram illustrating one of the neuromorphic cores in the systolic array package in FIG. 3 or FIG. 4 according to exemplary embodiments.

FIG. 14 is a block diagram illustrating one of the neuromorphic cores in the systolic array package in FIG. 3 or FIG. 4 according to exemplary embodiments.

Referring to FIG. 14, a neuromorphic core die 501 may include a synapse array 510, a plurality of first neurons 541, 542, . . . , 54N and a plurality of second neurons 551, 552, . . . , 55M. Each of the first neurons 541, 542, . . . , 54N may be referred to as a pre-synaptic neuron and each of the second neurons 551, 552, . . . , 55M may be referred to as a post-synaptic neuron.

The synapse array 510 includes a plurality of synapses 511, the synapse array 510 are connected to the first neurons 541, 542, . . . , 54N through a plurality of row lines RW1, RW2, . . . , RWN and the synapse array 510 are connected to the second neurons 551, 552, . . . , 55M through a plurality of column lines CL1, CL2, CLM and a plurality of selection lines SL1, SL2, . . . , SLM.

The synapse array 510 may store weights included in a plurality of layers of a neural network system and may perform operation based on the weights and the input data.

Figure 15:
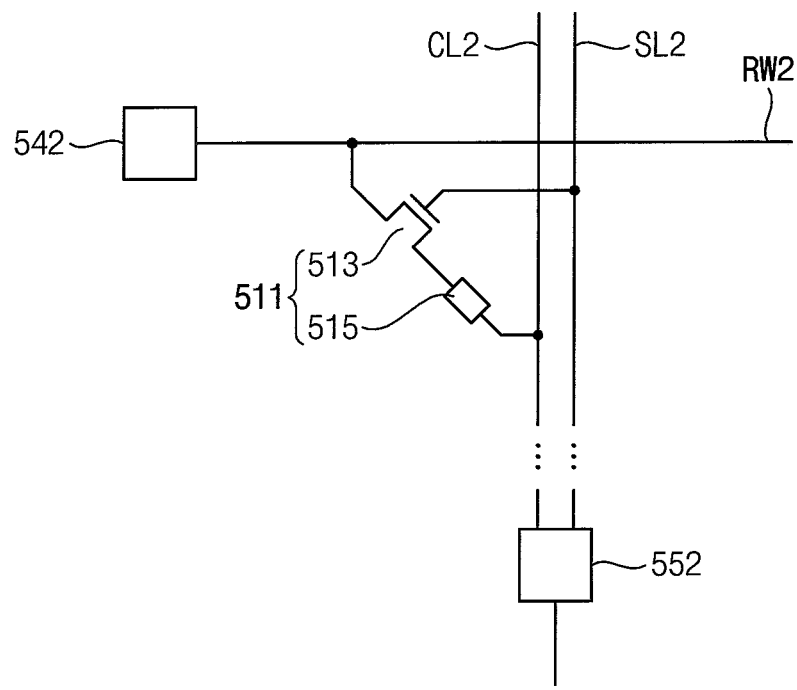
FIG. 15 illustrates one of the synapses in the synapse array in FIG. 14 according to exemplary embodiments.

FIG. 15 illustrates one of the synapses in the synapse array in FIG. 14 according to exemplary embodiments.

In FIG. 15, a synapse 511, a first neuron 542 connected to the synapse 511 through the row line RW2 and a second neuron 552 connected to the synapse 511 through the column line CL2 and a selection line SL2.

Referring to FIG. 15, synapse 511 includes a switching device 513 and a memristor 515, which are electrically connected with each other in series. The switching device 513 includes a 3-terminal selector such as a metal oxide semiconductor (MOS) transistor or a 2-terminal selector such as a diode. For example, in an embodiment in FIG. 16, the synapse 511 may include a switching transistor, as the switching device 513, electrically connected with the memristor 515 in series. When the switching device 513 is a switching transistor, a gate electrode of the switching transistor may be electrically connected with the second neuron 552 through the selection line SL2, a drain electrode of the switching transistor may be electrically connected with the first neuron 542 through the row line RW2, and a source electrode of the switching transistor may be electrically connected with a first electrode of the memristor 515. A second electrode of the memristor 515 may be electrically connected with the second neuron 552 through the column line CL2.

Referring to FIGS. 14 and 15, a row signal may be provided from the first neuron 511 to the synapse 511 through the row line RW2. When the switching device 513 of the synapses 511 is turned on, the row signal may be provided to the memristor 515. The row signal may control a resistance state of the memristor 515 by training the memristor 515 in any of a learning mode, an initializing mode, a potentiating mode, a set mode, a depressing mode, and a reset mode, or the row signal may be converted into a current value depending on the resistance state of the memristor 151. The resistance state of the memristor 515 may be changed by the row signal, or a current value depending on the resistance state of the memristor 515 may be output to the column line CL2 by the row signal. When the switching device 513 of the synapses 511 is turned on, a synapse weight may be provided and output to the column line CL2.

Figure 16:
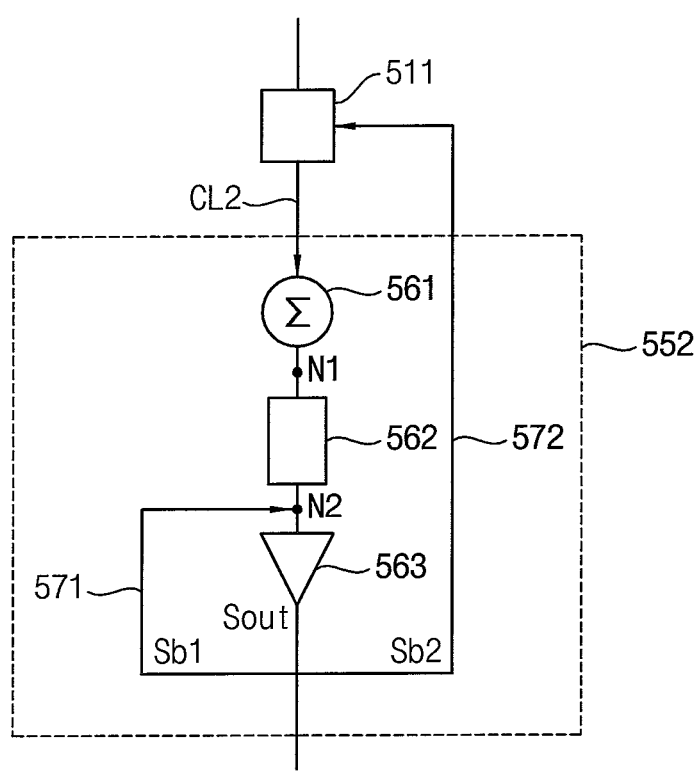
FIG. 16 illustrates a second neuron in FIG. 15 according to exemplary embodiments.

FIG. 16 illustrates a second neuron in FIG. 15 according to exemplary embodiments.

Referring to FIG. 16, the second neuron 552 may include a summation circuit 561, a variable resistor 562, and a comparator 563, which are electrically connected with each other in series.

An output node of a synapse 551, e.g., a column line CL2, may be electrically connected with an input terminal of the summation circuit 561. An output terminal of the summation circuit 561 may be electrically connected with a first electrode of the variable resistor 562 through a first node N1. A second electrode of the variable resistor 562 may be electrically connected with an input terminal of the comparator 563 through a second node N2. The second neuron 552 may further include a first feed-back line 571, which electrically connects an output terminal of the comparator 563 to the variable resistor 562, and a second feed-back line 572, which electrically connects the output terminal of the comparator 563 to the synapse 511. The first feed-back line 571 may be electrically connected with the second node N2, and the second feed-back line 572 may be electrically connected with a selection line SL2. In embodiments, the second feed-back line 572 may be a portion of the selection line SL2.

The summation circuit 561 may sum synapse weights of a plurality of synapses 511 on the same column line CL2, and may provide the summation of the synapse weights to the variable resistor 562. For example, the summation circuit 561 may include any of an adding circuit and an integrating circuit.

A resistance value or a conductance of the variable resistor 562 may be changed depending on outputs of the summation circuit 561 and/or the comparator 563. For example, the resistance value of the variable resistor 562 may be decreased according to the output of the summation circuit 561 in a set operation, and may be increased according to the output of the comparator 563 in a reset operation. For example, when a synapse current summed by the summation circuit 561 is relatively low, the variable resistor 562 may have a relatively high resistance level. Accordingly, a relatively low current and a relatively low synapse weight may be provided to the comparator 563. In contrast, when the synapse current summed by the summation circuit 561 is relatively high, the variable resistor 562 may have a relatively low resistance level. Accordingly, a relatively high current and a relatively high synapse weight may be provided to the comparator 563.

When the output of the variable resistor 562 is higher than a reference voltage of the comparator 563, the comparator 563 may output electrical signals. For example, the comparator 563 of the second neuron 552 may be fired. The electrical signals outputted by the fired comparator 563 may be output signals Sout. Portions of the output signals Sout may divaricate as first feed-back signals Sb1 and second feed-back signals Sb2.

The first feed-back signals Sb1 divaricated from the output signals Sout of the comparator 563 may be provided to the second electrode of the variable resistor 562 through the first feed-back line 571 and the second node N2, and may initialize the variable resistor 562. The output terminal of the comparator 563 may be electrically connected with a gate electrode of the switching transistor of the synapse 511 through the second feed-back line 572 and/or the selection line SL2. Accordingly, the second feed-back signals Sb2 divaricated from the output signals Sout of the comparator 563 may be provided to the gate electrode of the switching transistor and may set or reset the memristor 515 of the synapse 511. For example, the second feed-back signals Sb2 may be used as electrical signals for initiating a STDP operation, which changes the synapse weight of the synapse 511.

Figure 17:
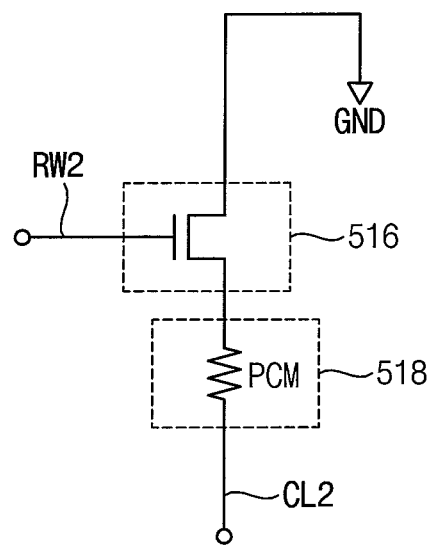
FIG. 17 illustrates one of the synapses in the synapse array in FIG. 14 according to exemplary embodiments.

FIG. 17 illustrates one of the synapses in the synapse array in FIG. 14 according to exemplary embodiments.

Referring to FIG. 17, a synapse 511a includes a transistor 516 and a phase-change device 518. The transistor 516 has a drain terminal connected to a ground voltage GND, a gate terminal connected to the row line RW2 and a source terminal connected to the phase-change device 518. The phase-change device 518 has a first terminal connected to the drain terminal of the transistor 516 and a second terminal connected to the column line CL2. The phase-change device 518 may store weight based on a change of a resistance value.

When the synapse 511a is included in the synapse array 510 in FIG. 15, the synapse array 510 may perform multiplication operation on the weights and the input data.

Figure 18:
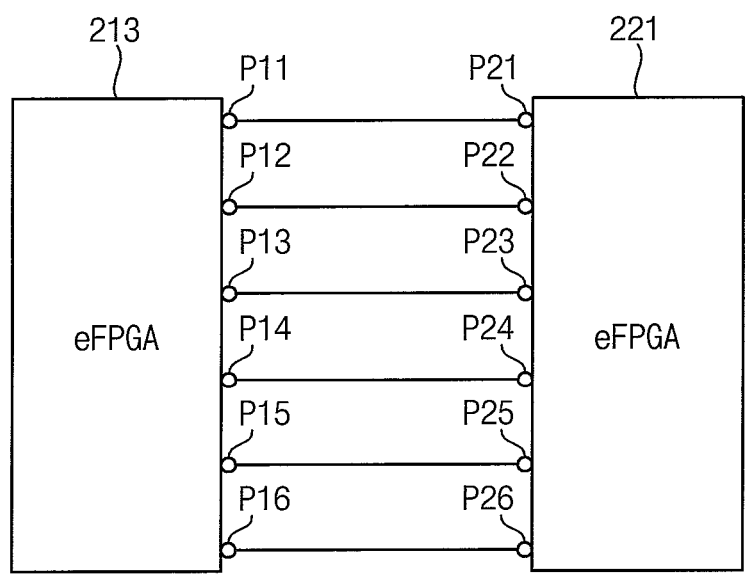
FIG. 18 illustrates corresponding embedded FPGAs of two adjacent neuromorphic chips in the systolic array package in FIG. 3.

FIG. 18 illustrates corresponding embedded FPGAs of two adjacent neuromorphic chips in the systolic array package in FIG. 3.

In FIG. 18, there are illustrated examples of the embedded FPGA 213 of the neuromorphic chip 210a and the embedded FPGA 221 of the neuromorphic chip 210b.

Referring to FIG. 18, the embedded FPGA 213 includes input/output (I/O) pins P11~P16 and the embedded FPGA 221 includes I/O pins P21~P26. Each of the I/O pins P11~P16 is physically connected to a respective one of the I/O pins P21~P26.

Figure 19:
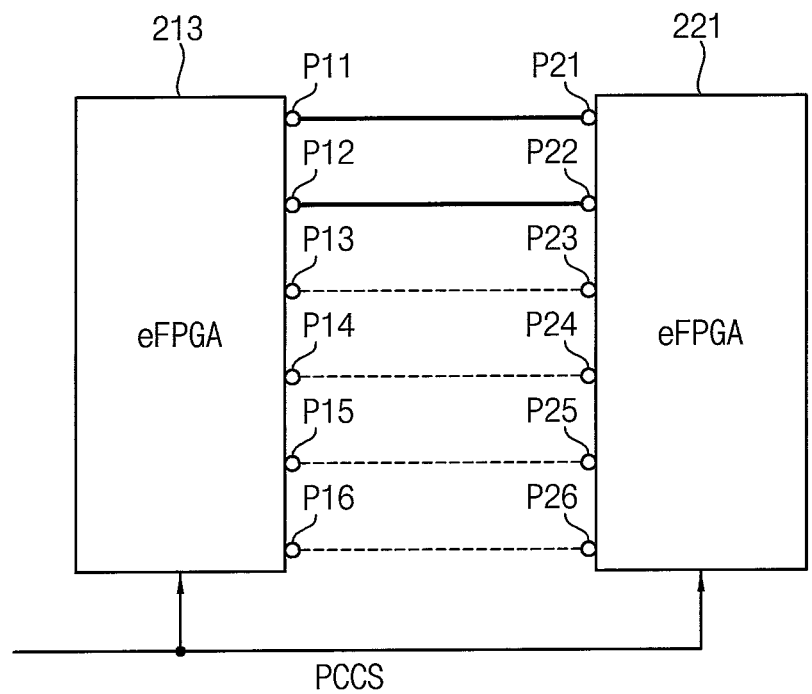
FIGS. 19 and 20 illustrate relationship of the embedded FPGAs in FIG. 18, respectively.
Figure 20:
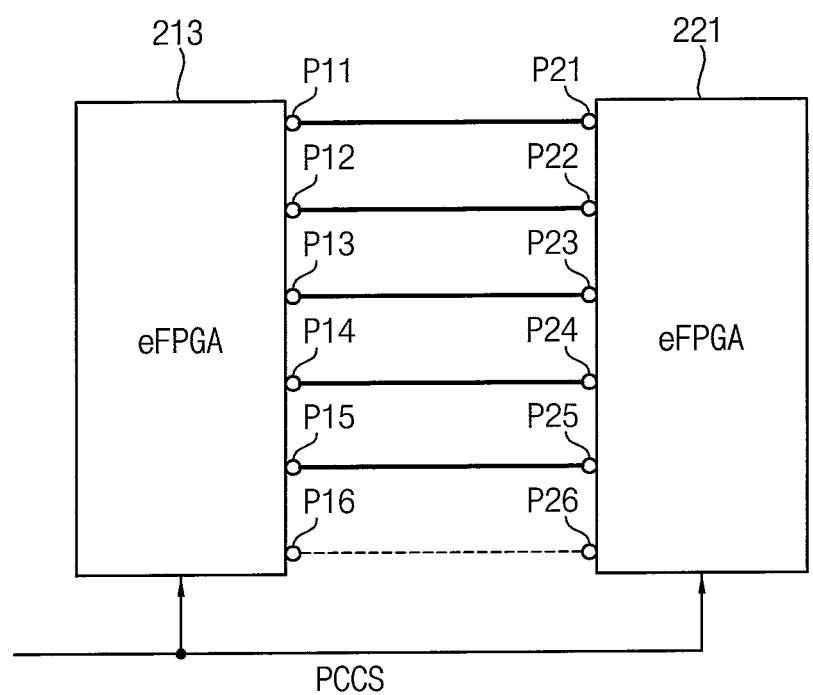

FIGS. 19 and 20 illustrate relationship of the embedded FPGAs in FIG. 18, respectively.

Referring to FIGS. 19 and 20, the controller 110 may adjust a number of enabled I/O pins of the I/O pins P11~P16 and P21~P26 based on the FPGA image FIMG.

In FIG. 19, the controller 110 may provide a pin configuration control signal PCCS to the embedded FPGAs 213 and 221 based on a performance request and the FPGA image FIMG from the host 20 to enable the I/O pins P11 and P12 and the I/O pins P21 and P22 corresponding to the I/O pins P11 and P12 in a low performance mode.

In FIG. 20, the controller 110 may provide the pin configuration control signal PCCS to the embedded FPGAs 213 and 221 based on a performance request and the FPGA image FIMG from the host 20 to enable the I/O pins P11, P12, P13, P14 and P15 and the I/O pins P21, P22, P23, P24 and P25 corresponding to the I/O pins P11, P12, P13, P14 and P15 in a high performance mode.

Therefore, the systolic array package 200a or 200b in FIG. 3 or FIG. 4 may reduce power consumption by adjusting a number of enabled I/O pins in the embedded FPGAs based on a performance request from the host 20.

Figure 21:
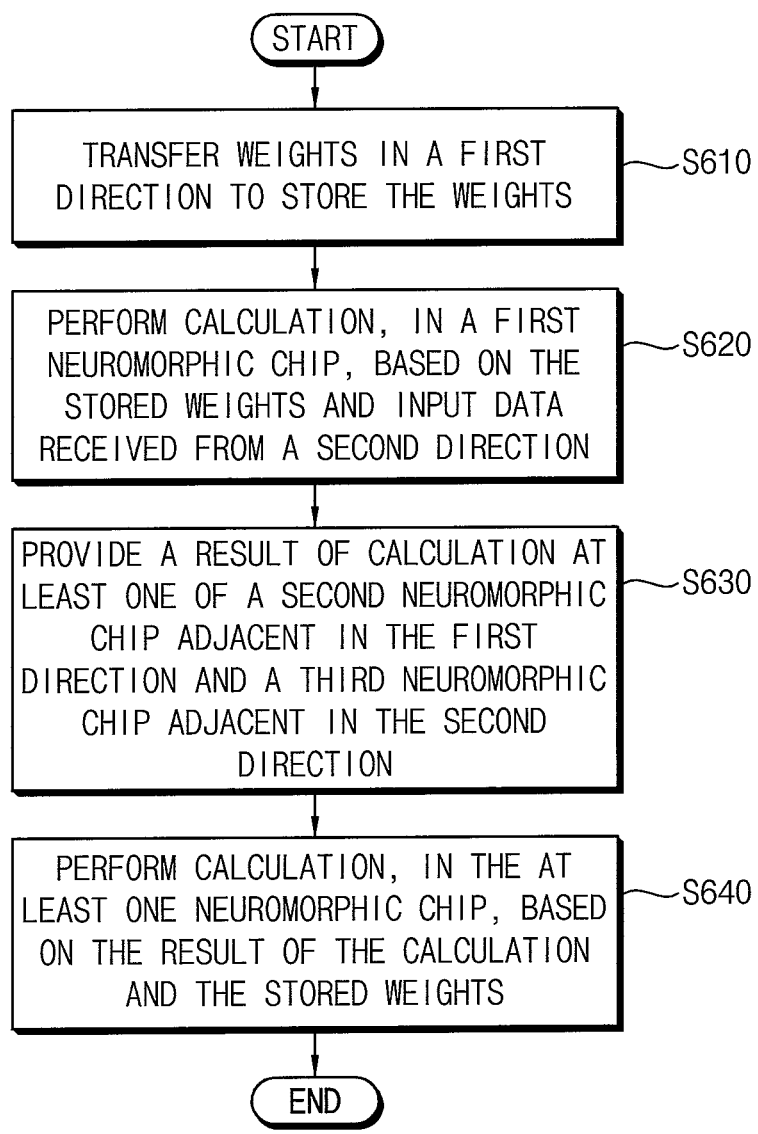
FIG. 21 is a flow chart illustrating a method of operating a neuromorphic package device according to exemplary embodiments.

FIG. 21 is a flow chart illustrating a method of operating a neuromorphic package device according to exemplary embodiments.

Referring to FIGS. 1 through 21, there is provided a method of operating a neuromorphic package device 100 which includes a systolic array package 200 including a plurality of neuromorphic chips arranged in a systolic array along a first direction and a second direction and a controller 110 to control the systolic array package 200. According to the method, each of the plurality of neuromorphic chips sequentially transfers weights of a plurality layers of a neural network system in the first direction to store the weights (S610). A first neuromorphic chip (e.g., a neuromorphic chip 210a in FIG. 3) of the plurality of neuromorphic chips performs a calculation based on stored weights therein and an input data received in the second direction (S620). The first neuromorphic chip provides a result of the calculation to at least one of a second neuromorphic chip (e.g., a neuromorphic chip 210b in FIG. 3) and a third neuromorphic chip (e.g., a neuromorphic chip 210d in FIG. 3), where the second neuromorphic chip is adjacent to the first neuromorphic chip in the first direction (e.g., D1 in FIG. 3) and the third neuromorphic chip is adjacent to the first neuromorphic chip in the second direction (e.g., D2 in FIG. 3) (S630). At least one of the second neuromorphic chip and the third neuromorphic chip performs a calculation based on provided result of the calculation and stored weights therein (S640).

Figure 22:
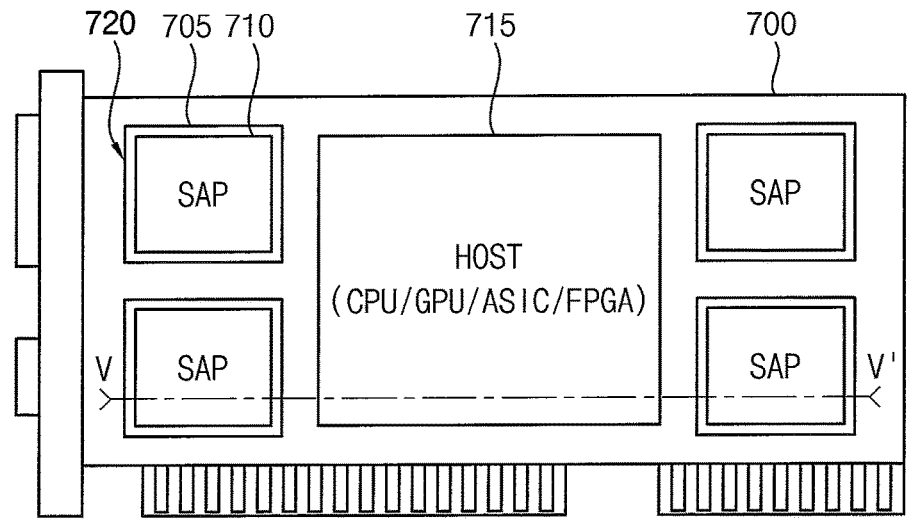
FIG. 22 is a block diagram illustrating a neuromorphic computing system according to exemplary embodiments.

FIG. 22 is a block diagram illustrating a neuromorphic computing system according to exemplary embodiments.

Referring to FIG. 22, a neuromorphic computing system 700 may include a host 715 and at least one neuromorphic package device 720.

The host 715 may include at least one of a central processing unit (CPU), a graphics processing unit (GPU), an application specific integrated circuit (ASIC), or a field programmable gate array (FPGA). The at least one neuromorphic package device 720 may include a controller 705 and a systolic array package 710 including a plurality of neuromorphic chips formed on the controller 705. The neuromorphic computing system 700 may be peripheral component interconnect express (PCI-e) compatible board.

Figure 23:
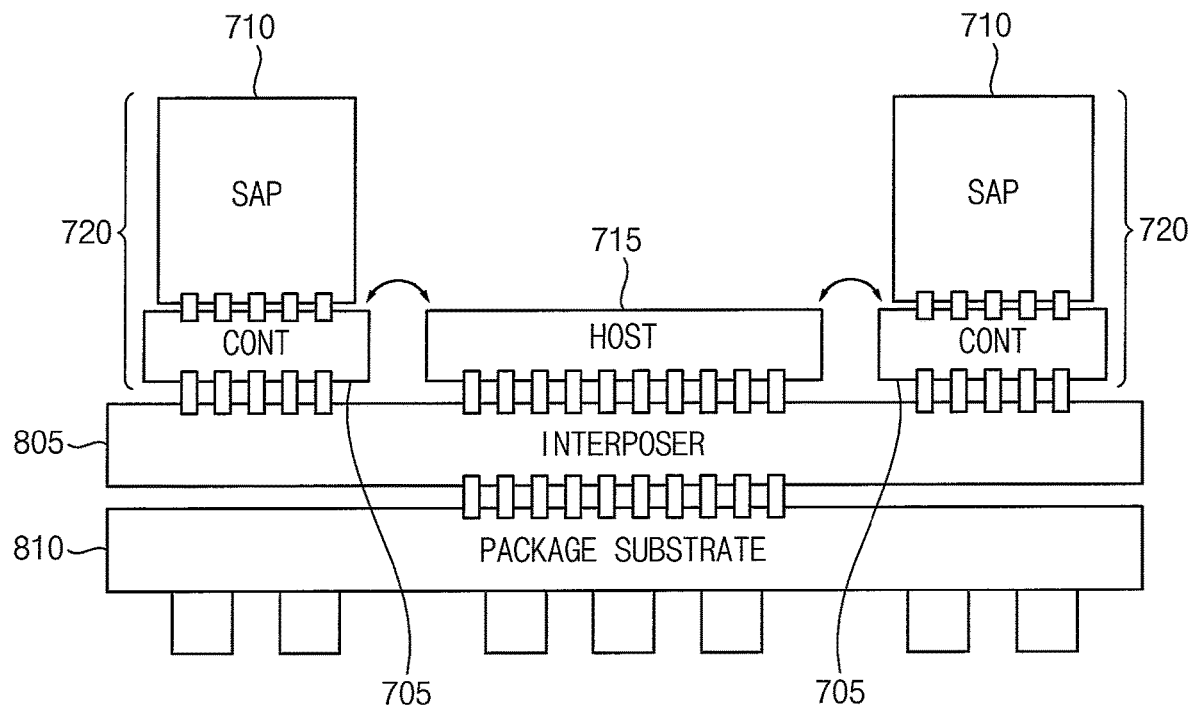
FIG. 23 illustrates a cross-sectional view of the neuromorphic computing system of FIG. 22 taken along line V-V'.

FIG. 23 illustrates a cross-sectional view of the neuromorphic computing system of FIG. 22 taken along line V-V'.

Referring to FIG. 23, the plurality of systolic array packages 710 are stacked on the controller 705, forming the neuromorphic package device 720.

A plurality of neuromorphic package devices 720 may be included on the neuromorphic computing system 700. The host 715 may communicate with each of the controllers 705.

The host 715 and the controllers 705 may be disposed atop and coupled to an interposer 805. The interposer 805 may be disposed atop and coupled to a package substrate 810.

Each of the neuromorphic package devices 720 may employ the neuromorphic package device 200a of FIG. 3 and the neuromorphic package device 200b of FIG. 4. Therefore, each of the neuromorphic package devices 720 includes a plurality of neuromorphic chips arranged in a systolic array along a first direction and a second direction, and each of the plurality of neuromorphic chips is configured to sequentially transfer weights of a plurality layers of a neural network system in the first direction to store the weights. A first neuromorphic chip of the plurality of neuromorphic chips is configured to perform a calculation based on stored weights therein and an input data received in the second direction, and is configured to provide a result of the calculation at least one of a second neuromorphic chip and a third neuromorphic chip, wherein the second neuromorphic chip is adjacent to the first neuromorphic chip in the first direction and the third neuromorphic chip is adjacent to the first neuromorphic chip in the second direction.

Therefore, the neuromorphic computing system may increase calculation performance with reducing power consumption.

Aspects of the present inventive concept may be applied to various devices that employ artificial intelligence to increase data processing efficiency.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure and as defined in the claims.

What is claimed is:

1. A neuromorphic package device comprising:
 a systolic array package including a plurality of neuromorphic chips arranged in a systolic array along a first direction and a second direction; and
 a controller configured to communicate with a host external to the neuromorphic package device and configured to control the plurality of neuromorphic chips,
 wherein each of the plurality of neuromorphic chips is configured to sequentially transfer weights of a plurality layers of a neural network system in the first direction to store the weights,
 wherein a first neuromorphic chip of the plurality of neuromorphic chips is configured to perform a calculation based on stored weights therein and an input data received in the second direction, and is configured to provide a result of the calculation to at least one of a second neuromorphic chip and a third neuromorphic chip, the second neuromorphic chip being adjacent to the first neuromorphic chip in the first direction and the third neuromorphic chip being adjacent to the first neuromorphic chip in the second direction, and
 wherein the at least one neuromorphic chip of the second neuromorphic chip and the third neuromorphic chip is configured to perform a calculation based on a provided result of the calculation and stored weights therein, and
 wherein each of the plurality of neuromorphic chips includes:
 a neuromorphic core including a synapse array coupled to a plurality of row lines and a plurality of column lines, the synapse array including a plurality of synapses configured to store the weights and configured to perform the calculation based on the weights and the input data; and a plurality of embedded field programmable gate arrays (FPGAs) disposed adjacently to the neuromorphic core.

2. The neuromorphic package device of claim 1, wherein:
the embedded FPGAs are configured to communicate with an adjacent neuromorphic core or an outside of the systolic array package, and
the controller is configured to program the embedded FPGAs based on an FPGA image provided from the host.

3. The neuromorphic package device of claim 2, wherein;
each of the embedded FPGAs is configured to use one of Peripheral Component Interconnect Express (PCIe) interface protocol, Cache Coherent Interconnect for accelerators (CCIX) interface protocol and Gen-Z interface protocol; and
each of the embedded FPGAs is configured to perform one of a transmission operation and a reception operation.

4. The neuromorphic package device of claim 2, wherein first embedded FPGAs of the embedded FPGAs are configured to communicate with the outside of the systolic array package and second embedded FPGAs of the embedded FPGAs are configured to communicate with the adjacent neuromorphic cores using different interface protocols.

5. The neuromorphic package device of claim 2, wherein;
each of the embedded FPGAs includes a plurality of input/output (I/O) pins; and
the controller is configured to adjust a number of enabled I/O pins of the I/O pins based on a performance request from the host.

6. The neuromorphic package device of claim 2, wherein a plurality of synapses are configured to perform multiplication operation on the weights and the input data and to perform accumulation operation to accumulate a result of the multiplication operation.

7. The neuromorphic package device of claim 2, wherein the plurality of synapses are configured to perform multiplication operation on the weights and the input data.

8. The neuromorphic package device of claim 2, wherein each of the synapses includes a resistive element,
wherein the synapses are configured to generate a plurality of read currents based on an input data and the weights,
wherein the plurality of read currents represent a result of multiplication and accumulation operations performed by the neural network system,
wherein the neuromorphic core includes:
a plurality of current-to-voltage converters configured to convert the plurality of read currents into a plurality of signal voltages;
a plurality of analog-to-digital converters configured to convert the plurality of signal voltages into a plurality of digital signals;
a plurality of adders configured to sum the plurality of digital signals; and
a plurality of shift registers configured to generate final output data based on an output of the plurality of adders.

9. The neuromorphic package device of claim 2, wherein the synapse array further includes:
first neurons connected to the synapses through the row lines; and
second neurons connected to the synapses through the column lines,
wherein each of the synapses includes:
a memristor whose resistance value is configured to be changed; and
a transistor connected to the memristor, the transistor configured to receive at least two input signals, wherein the resistance value of the memristor is changed based on a time difference between the at least two input signals received by the transistor, and
wherein each of the second neurons is configured to generate a spike fired with reference to a resting voltage.

10. The neuromorphic package device of claim 9, wherein the resistance value of the memristor is changed based on a voltage change caused by the time difference between the at least two input signals.

11. The neuromorphic package device of claim 9, wherein the resistance value of the memristor is changed based on a time difference between a first input signal applied to a gate terminal of the transistor and a second input signal based on a membrane voltage applied to a source terminal of the transistor, and
wherein a direction of a current flowing on the memristor is determined by a voltage difference caused by the time difference between the first input signal and the second input signal.

12. The neuromorphic package device of claim 2, wherein the synapse array further includes:
first neurons connected to the synapses through the row lines; and
second neurons connected to the synapses through the column lines,
wherein each of the synapses includes a switching device and a memristor connected to each other in series, and
wherein each of the second neurons includes a summation circuit, a variable resistor and a comparator connected to each other in series.

13. The neuromorphic package device of claim 12, wherein each of the second neurons further includes:
a first feed-back line that electrically connects an output terminal of the comparator to the variable resistor; and
a second feed-back line that electrically connects the output terminal of the comparator to the switching device, and
wherein each of the second neurons is configured to provide the variable resistor with a first portion of an output signal of the comparator through the first feed-back line and is configured to provide the switching device with a second portion of the output signal of the comparator through the second feed-back line.

14. The neuromorphic package device of claim 2, wherein the synapse array further includes:
first neurons connected to the synapses through the row lines; and
second neurons connected to the synapses through the column lines,
wherein each of the synapses includes a transistor and a phase change device connected to each other in series,
wherein the transistor includes a source terminal connected to a ground voltage and a gate terminal connected to one of the row lines, and
wherein the phase change device includes a first terminal connected to the source terminal of the transistor and a second terminal connected to one of the column lines.

15. The neuromorphic package device of claim 1, wherein the plurality of neuromorphic chips are arranged in two dimensions along the first direction and the second direction.

16. The neuromorphic package device of claim 1, wherein the plurality of neuromorphic chips are arranged in two dimensions along the first direction and the second direction in each of a plurality of physical layers and the plurality of physical layers are stacked in a third direction perpendicular to the first direction and the second direction.

17. A neuromorphic computing system comprising
a host including at least one of a central processing unit (CPU), a graphics processing unit (GPU), an application specific integrated circuit (ASIC), or a field programmable gate array (FPGA) and storing a FPGA image; and
at least one neuromorphic package controlled by the host, wherein the at least one neuromorphic package includes:
a systolic array package including a plurality of neuromorphic chips arranged in a systolic array along a first direction and a second direction; and
a plurality of core dies; and
a controller configured to communicate with the host, which is external to the neuromorphic package and configured to control the plurality of neuromorphic chips,
wherein each of the plurality of neuromorphic chips is configured to sequentially transfer weights of a plurality layers of a neural network system in the first direction to store the weights,
wherein a first neuromorphic chip of the plurality of neuromorphic chips is configured to perform a calculation based on stored weights therein and an input data received in the second direction, and is configured to provide a result of the calculation to at least one of a second neuromorphic chip and a third neuromorphic chip, the second neuromorphic chip being adjacent to the first neuromorphic chip in the first direction and the third neuromorphic chip being adjacent to the first neuromorphic chip in the second direction,
wherein the at least one of the second neuromorphic chip and the third neuromorphic chip is configured to perform a calculation based on a result of the calculation provided from the first neuromorphic chip and weights stored therein, and
wherein each of the plurality of neuromorphic chips includes:
a neuromorphic core including a synapse array coupled to a plurality of row lines and a plurality of column lines, the synapse array including a plurality of synapses configured to store the weights and configured to perform the calculation based on the weights and the input data; and
a plurality of embedded FPGAs disposed adjacently to the neuromorphic core.

18. The neuromorphic computing system of claim 17, wherein:
the embedded FPGAs are configured to communicate with an adjacent neuromorphic core or an outside of the systolic array package, and
the controller is configured to program the embedded FPGAs based on the FPGA image provided from the host.

19. The neuromorphic computing system of claim 17, further comprising:
an interposer connected to the host; and
a substrate connected to the interposer.

20. A neuromorphic package comprising:
a systolic array package including a plurality of neuromorphic chips arranged in a systolic array along a first direction and a second direction; and
a controller configured to communicate with a host external to the neuromorphic package and configured to control the plurality of neuromorphic chips,
wherein each of the plurality of neuromorphic chips is configured to sequentially transfer weights of a plurality layers of a neural network system in the first direction to store the weights,
wherein a first neuromorphic chip of the plurality of neuromorphic chips is configured to perform a calculation based on stored weights therein and an input data received in the second direction, and is configured to provide a result of the calculation to at least one of a second neuromorphic chip and a third neuromorphic chip, the second neuromorphic chip being adjacent to the first neuromorphic chip in the first direction and the third neuromorphic chip being adjacent to the first neuromorphic chip in the second direction,
wherein the at least one of the second neuromorphic chip and the third neuromorphic chip is configured to perform a calculation based on a result of the calculation provided from the first neuromorphic chip and weights stored therein, and
wherein each of the plurality of neuromorphic chips includes:
a neuromorphic core including a synapse array coupled to a plurality of row lines and a plurality of column lines, the synapse array including a plurality of synapses configured to store the weights and configured to perform the calculation based on the weights and the input data; and
a plurality of embedded field programmable gate array (FPGA)s disposed adjacently to the neuromorphic core, the embedded FPGAs configured to communicate with an adjacent neuromorphic core or an outside,
wherein the controller is configured to program the embedded FPGAs based on a FPGA image provided from the host,
wherein each of the embedded FPGAs is configured to use one of Peripheral Component Interconnect Express (PCIe) interface protocol, Cache Coherent Interconnect for accelerators (CCIX) interface protocol and Gen-Z interface protocol, and
wherein each of the embedded FPGAs is configured to perform one of a transmission operation and a reception operation.

* * * * *